United States Patent
Jung et al.

(10) Patent No.: US 10,177,206 B2
(45) Date of Patent: Jan. 8, 2019

(54) ORGANIC LIGHT EMITTING DISPLAY DEVICE HAVING EAVES STRUCTURE AND METHOD OF MANUFACTURING THE SAME

(71) Applicant: LG DISPLAY CO., LTD., Seoul (KR)

(72) Inventors: DeukSoo Jung, Paju-si (KR); Yongsun Jo, Seoul (KR); YoungEun Hong, Gumi-si (KR); SungSoo Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 15/367,938

(22) Filed: Dec. 2, 2016

(65) Prior Publication Data
US 2018/0097047 A1    Apr. 5, 2018

(30) Foreign Application Priority Data

Sep. 30, 2016  (KR) .................. 10-2016-0127076

(51) Int. Cl.
```
H01L 29/20      (2006.01)
H01L 33/00      (2010.01)
H01L 27/32      (2006.01)
H01L 51/52      (2006.01)
H01L 51/56      (2006.01)
```
(52) U.S. Cl.
CPC ...... H01L 27/3246 (2013.01); H01L 27/3248 (2013.01); H01L 27/3258 (2013.01); H01L 51/5225 (2013.01); H01L 51/5228 (2013.01); H01L 51/56 (2013.01); *H01L 27/3272* (2013.01); *H01L 27/3276* (2013.01); *H01L 2227/323* (2013.01); *H01L 2251/5315* (2013.01)

(58) Field of Classification Search
CPC ............ H01L 27/3244; H01L 27/3272; H01L 51/5228
USPC ..... 257/40, 59, 89, E51.019; 438/22, 29, 35
See application file for complete search history.

(56) References Cited

U.S. PATENT DOCUMENTS

| | | | |
|---|---|---|---|
| 2005/0110023 A1* | 5/2005 | Lee ..................... | H01L 27/3276 257/72 |
| 2009/0153046 A1* | 6/2009 | Hayashi .............. | H01L 27/3276 313/505 |
| 2009/0256477 A1* | 10/2009 | Chung ................. | H01L 27/3246 313/505 |
| 2010/0072482 A1* | 3/2010 | Eom .................... | H01L 27/3276 257/72 |
| 2010/0244664 A1* | 9/2010 | Fujioka ............... | H01L 51/5212 313/504 |
| 2013/0256638 A1* | 10/2013 | Uesugi ................ | H01L 51/5228 257/40 |
| 2014/0159002 A1* | 6/2014 | Lee ..................... | H01L 27/3246 257/40 |

(Continued)

*Primary Examiner* — Lex Malsawma
*Assistant Examiner* — Eric W Jones
(74) *Attorney, Agent, or Firm* — Birch, Stewart, Kolasch & Birch, LLP

(57) ABSTRACT

Disclosed is an organic light emitting display device that may include an anode electrode and an eave structure under a bank layer and spaced apart from each other, a cathode electrode on the bank layer, and an auxiliary electrode under the eave structure and electrically connected with the cathode electrode, wherein the cathode electrode extends to a contact space under the eave structure, and the extending cathode electrode is connected with the auxiliary electrode in the contact space.

20 Claims, 25 Drawing Sheets

(56) References Cited

U.S. PATENT DOCUMENTS

| | | | | |
|---|---|---|---|---|
| 2014/0353609 A1* | 12/2014 | Song | .................... | H01L 27/3276 |
| | | | | 257/40 |
| 2015/0187959 A1* | 7/2015 | Yoon | .................... | H01L 27/1225 |
| | | | | 257/43 |
| 2015/0206929 A1* | 7/2015 | Sato | ........................ | H01L 27/32 |
| | | | | 257/40 |
| 2015/0206931 A1* | 7/2015 | Choi | .................... | H01L 27/3272 |
| | | | | 257/72 |
| 2015/0379923 A1* | 12/2015 | Lee | ...................... | G09G 3/3233 |
| | | | | 345/206 |
| 2016/0020422 A1* | 1/2016 | Kim | .................... | H01L 51/5228 |
| | | | | 257/40 |
| 2016/0043341 A1* | 2/2016 | Heo | .................... | H01L 27/3246 |
| | | | | 257/40 |
| 2016/0149155 A1* | 5/2016 | Kim | .................... | H01L 51/5228 |
| | | | | 257/40 |
| 2016/0254338 A1* | 9/2016 | Lin | ...................... | H01L 27/3272 |
| | | | | 257/40 |

\* cited by examiner ized by the structure particularly pointed out in the written description
ORGANIC LIGHT EMITTING DISPLAY DEVICE HAVING EAVES STRUCTURE AND METHOD OF MANUFACTURING THE SAME

CROSS REFERENCE TO RELATED APPLICATION

This application claims the benefit of the Korean Patent Application No. 10-2016-0127076 filed on Sep. 30, 2016, which is hereby incorporated by reference as if fully set forth herein.

BACKGROUND OF THE INVENTION

Field of the Disclosure

Embodiments of the present invention relate to an organic light emitting display device, and more particularly, to a top emission type organic light emitting display device and a method of manufacturing the same.

Discussion of the Related Art

An organic light emitting display (OLED) device, which is a self light emitting display device, has advantages of low power consumption, rapid response speed, high emission efficiency, high luminance and wide viewing angle.

According to a direction of light emitted from an organic light emitting device, the OLED device may be largely classified into a top emission type and a bottom emission type. In the instance of the bottom emission type, a circuit device is disposed between an emitting layer and an image displaying surface, whereby an aperture ratio may be lowered due to the circuit device. Meanwhile, in the instance of the top emission type, a circuit device is not disposed between an emitting layer and an image displaying surface, whereby an aperture ratio may be improved.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to lower a resistance of a cathode electrode 80 to be explained later.

On the anode electrode 40 and the auxiliary electrode 50, a bank 60 is provided to define a pixel region. Also, an organic emitting layer 70 is provided in the pixel region defined by the bank 60, and the cathode electrode 80 is provided on the organic emitting layer 70.

In the instance of the top emission type, light emitted from the organic emitting layer 70 passes through the cathode electrode 80. In this context, the cathode electrode 80 is formed of a transparent conductive material, which causes the increase of resistance therein. In order to lower the resistance in the cathode electrode 80, the cathode electrode 80 is connected with the auxiliary electrode 50.

In order to connect the cathode electrode 80 with the auxiliary electrode 50, an upper surface of the auxiliary electrode 50 is not covered by the organic emitting layer 70. That is, the upper surface of the auxiliary electrode 50 is exposed to the outside after a process of forming the organic emitting layer 70 so that the cathode electrode 80 is connected with the upper surface of the auxiliary electrode 50. In the instance of the related art, a reverse-tapered partition 65 is provided on the upper surface of the auxiliary electrode 50 so as to prevent the upper surface of the auxiliary electrode 50 from being covered by the organic emitting layer 70.

Owing to the reverse-tapered partition 65, a gap space is provided between the bank 60 and the partition 65. In this instance, the reverse-tapered partition 65 serves as an eave so that the organic emitting layer 70 is not deposited in the gap space. That is, the organic emitting layer 70 is formed by a deposition process using a deposition material with superior straightness, for example, an evaporation process. According to the partition 65 serving as the eave during the deposition process of the organic emitting layer 70, the organic emitting layer 70 is not deposited in the gap space between the bank 60 and the partition 65.

Meanwhile, the cathode electrode 80 may be formed by a deposition process using a deposition material with inferior straightness, for example, a sputtering process. Thus, the cathode electrode 80 may be deposited in the gap space between the bank 60 and the partition 65, whereby the cathode electrode 80 and the auxiliary electrode 50 may be electrically connected with each other.

However, the related art top emission type OLED device inevitably including the reverse-tapered partition 65 may cause the following disadvantages.

A PEB (Post Exposure Bake) process should be carried out so as to pattern the reverse-tapered partition 65. The PEB process is very complicated so that it is difficult to obtain a desired reverse-tapered shape. If the reverse-tapered structure is not formed in a desired shape, the partition 65 may be collapsed or peeled-off. In this instance, it is difficult to electrically connect the cathode electrode 80 and the auxiliary electrode 50 with each other.

SUMMARY OF THE INVENTION

Accordingly, embodiments of the present invention are directed to a top emission type organic light emitting display device that substantially obviates one or more problems due to limitations and disadvantages of the related art, and a method of manufacturing the same.

An aspect of embodiments of the present invention is directed to provide a top emission type organic light emitting display device which facilitates an electrical connection between a cathode electrode and an auxiliary electrode without forming a reverse-tapered partition, and a method of manufacturing the same.

Additional advantages and features of embodiments of the invention will be set forth in part in the description which follows and in part will become apparent to those having ordinary skill in the art upon examination of the following, or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting display device that may include an anode electrode and an eave structure provided under a bank layer and spaced apart from each other, a cathode electrode provided on the bank layer, and an auxiliary electrode provided under the eave structure and electrically connected with the cathode electrode. In this instance, the cathode electrode extends to a contact space under the eave structure, and the extending cathode electrode is connected with the auxiliary electrode in the contact space.

Also, an organic light emitting display device may be manufactured by steps of providing an auxiliary electrode on a substrate, providing a passivation layer and a planarization layer on the auxiliary electrode, providing an anode electrode and an eave structure on the planarization layer, providing a contact hole in the passivation layer and the planarization layer so as to expose the auxiliary electrode, and providing a bank layer, an organic emitting layer, and a cathode electrode on the anode electrode and the eave structure. In this instance, the cathode electrode extends to a contact space under the eave structure, and the extending cathode electrode is connected with the exposed auxiliary electrode.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE EMBODIMENTS

Figure 1:
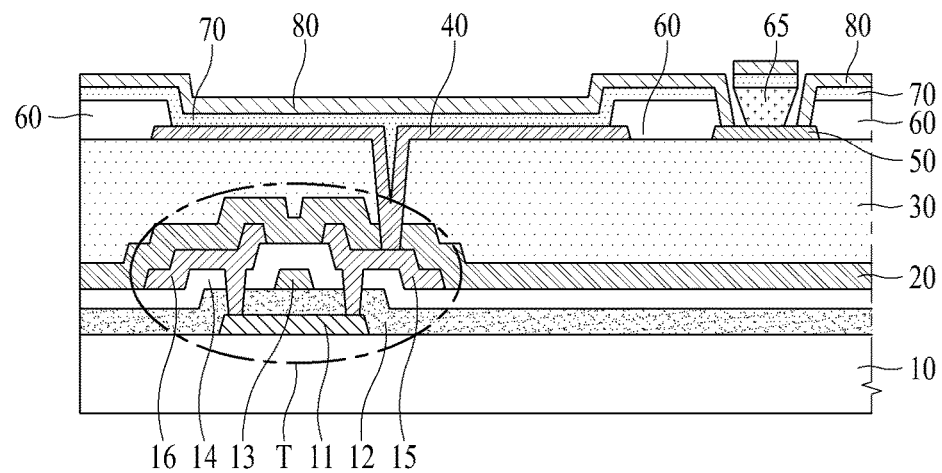
FIG. 1 is a cross sectional view illustrating a top emission type OLED device according to the related art.

Reference will now be made in detail to the exemplary embodiments of the present invention, examples of which are illustrated in the accompanying drawings. Wherever possible, the same reference numbers will be used throughout the drawings to refer to the same or like parts. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of the claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In an instance where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including an instance where the structures contact each other and moreover, an instance where a third structure is disposed therebetween.

In describing a time relationship, for example, when the temporal order is described as 'after~', 'subsequent~', 'next~', and 'before~', an instance which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in a co-dependent relationship.

Hereinafter, an organic light emitting display (OLED) device according to embodiments of the present invention will be described in detail with reference to the accompanying drawings.

Figure 2A:
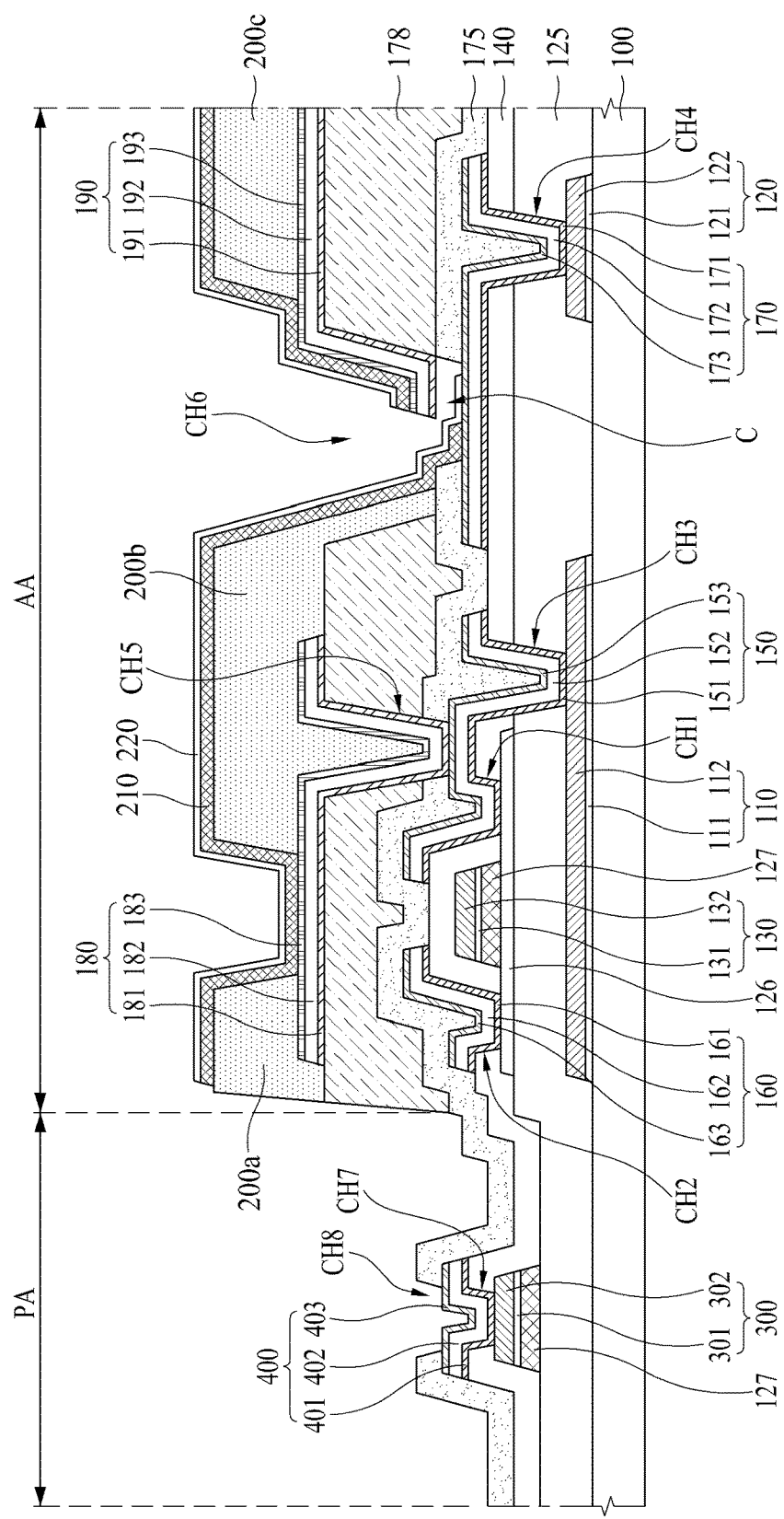
FIG. 2A is a cross sectional view illustrating an OLED device according to one embodiment of the present invention.
Figure 2B:
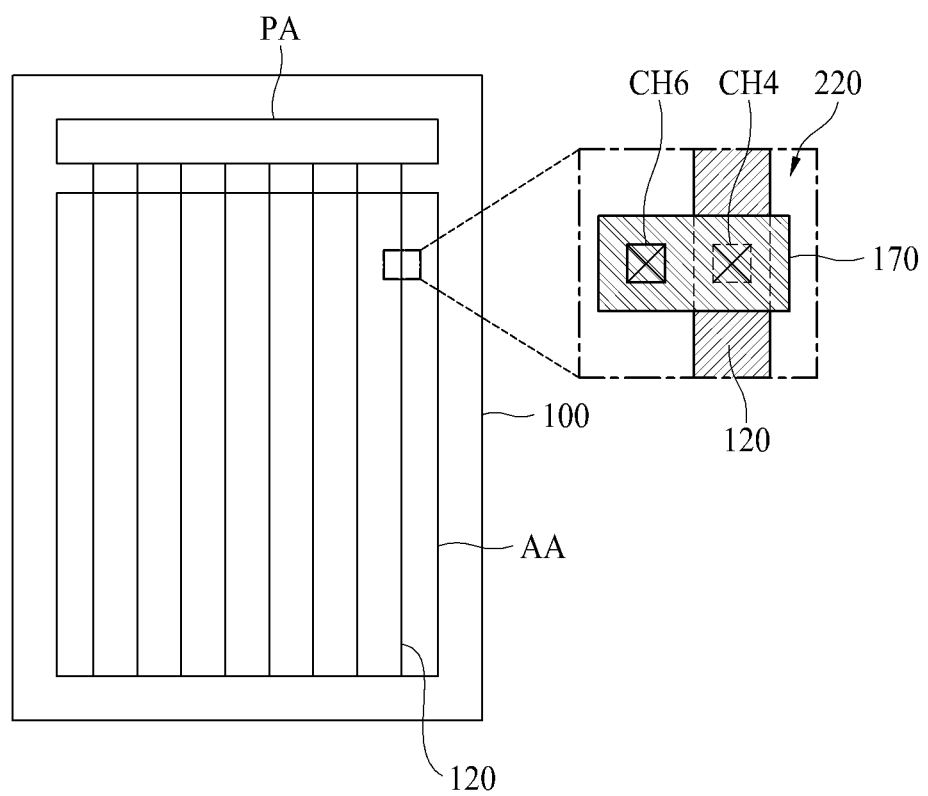
FIG. 2B is a plane view illustrating the OLED device according to one embodiment of the present invention.

FIG. 2A is a cross sectional view illustrating an OLED device according to one embodiment of the present invention, and FIG. 2B is a plane view illustrating the OLED device according to one embodiment of the present invention.

As shown in FIG. 2A, the OLED device according to one embodiment of the present invention may include an active area (AA) and a pad area (PA) on a substrate 100. First, a structure of the active area (AA) on the substrate 100 will be described in detail as follows. The substrate 100 may be formed of glass or transparent plastic.

A light shielding layer 110 and a low-voltage line (VSS) 120 are provided on the substrate 100. The light shielding layer 110 reduces or prevents a light incidence on an active layer 126 to be explained later, and the low-voltage line (VSS) 120 applies a low voltage to a cathode electrode 220. Also, the low-voltage line (VSS) 120 together with an auxiliary electrode 170 lowers a resistance of the cathode electrode 220.

The light shielding layer 110 and the low-voltage line (VSS) 120 are provided in the same layer, and are formed of the same material. In this instance, the light shielding layer 110 and the low-voltage line (VSS) 120 may be manufactured at the same time by the same process.

The light shielding layer 110 may include a lower light shielding layer 111 and an upper light shielding layer 112. The low-voltage line (VSS) 120 may include a lower low-voltage line (VSS) 121 and an upper low-voltage line (VSS) 122. The lower light shielding layer 111 and the lower low-voltage line (VSS) 121 may be formed of the same material, and the upper light shielding layer 112 and the upper low-voltage line (VSS) 122 may be formed of the same material.

The lower light shielding layer 111 prevents a lower surface of the upper light shielding layer 112 from being corroded. The lower low-voltage line (VSS) 121 prevents a lower surface of the upper low-voltage line (VSS) 122 from being corroded. Accordingly, an oxidation degree of each of the lower light shielding layer 111 and the lower low-voltage line (VSS) 121 is lower than an oxidation degree of each of the upper light shielding layer 112 and the upper low-voltage line (VSS) 122, and a corrosion resistance in each of the lower light shielding layer 111 and the lower low-voltage line (VSS) 121 is superior to a corrosion resistance in each of the upper light shielding layer 112 and the upper low-voltage line (VSS) 122. For example, the lower light shielding layer 111 and the lower low-voltage line (VSS) 121 may be formed of an alloy (MoTi) of molybdenum and titanium, but are not limited to these materials.

A resistance in a material for the upper light shielding layer 112 and the upper low-voltage line (VSS) 122 may be lower than a resistance in a material for the lower light shielding layer 111 and the lower low-voltage line (VSS) 121. For example, the upper light shielding layer 112 and the upper low-voltage line (VSS) 122 may be formed of a metal material such as copper (Cu), but are not limited to this material. In order to lower a total resistance of the low-voltage line (VSS) 120, a thickness of the upper low-voltage line (VSS) 122 is larger than a thickness of the lower low-voltage line (VSS) 121, preferably, but such is not required.

A buffer layer 125 is provided on the light shielding layer 110 and the low-voltage line (VSS) 120. The buffer layer 125 extends from the active area (AA) to the pad area (PA). The buffer layer 125 may be formed of an inorganic insulating material, for example, a silicon oxide film (SiOx), a silicon nitride film (SiNx), or a multi-layered film including silicon oxide (SiOx) and silicon nitride (SiNx), but is not limited to those.

A thin film transistor including an active layer 126, a gate electrode 130, a source electrode 150, and a drain electrode 160 is provided on the buffer layer 125.

The active layer 126 is provided on the buffer layer 125, a gate insulating film 127 is provided on the active layer 126, the gate electrode 130 is provided on the gate insulating film 127, an insulating interlayer 140 is provided on the gate electrode 130, and the source electrode 150, drain electrode 160 and auxiliary electrode 170 are provided on the insulating interlayer 140. The active layer 126 may be formed of a silicon-based semiconductor material or an oxide-based semiconductor material.

The gate insulating film 127 insulates the active layer 126 and the gate electrode 130 from each other. The gate insulating film 127 and the gate electrode 130 may have the same pattern. The gate insulating film 127 may be formed of an inorganic insulating material, for example, a silicon oxide film (SiOx), a silicon nitride film (SiNx), or a multi-layered film including silicon oxide (SiOx) and silicon nitride (SiNx), but is not limited to those.

The gate electrode 130 may include a lower gate electrode 131 and an upper gate electrode 132. The lower gate electrode 131 prevents a lower surface of the upper gate electrode 132 from being corroded. Thus, an oxidation degree of the lower gate electrode 131 is lower than an oxidation degree of the upper gate electrode 132, and a corrosion resistance of the lower gate electrode 131 is superior to a corrosion resistance of the upper gate electrode 132. For example, the lower gate electrode 131 may be formed of an alloy (MoTi) of molybdenum and titanium, but are not limited to these materials. A resistance in a material for the upper gate electrode 132 may be lower than a resistance in a material for the lower gate electrode 131. For example, the upper gate electrode 132 may be formed of a metal material such as copper (Cu), but is not limited to this material. In order to lower a total resistance of the gate electrode 130, a thickness of the upper gate electrode 132 is larger than a thickness of the lower gate electrode 131, preferably, but such is not required.

The insulating interlayer 140 may be formed of an inorganic insulating material, for example, a silicon oxide film (SiOx), a silicon nitride film (SiNx), or a multi-layered film including silicon oxide (SiOx) and silicon nitride (SiNx), but is not limited to those. The insulating interlayer 140 may extend from the active area (AA) to the pad area (PA).

The source electrode 150 and the drain electrode 160 confronting each other are provided on the insulating interlayer 140. In the insulating interlayer 140, there are a first contact hole (CH1) for exposing one end area of the active layer 126, and a second contact hole (CH2) for exposing the other end area of the active layer 126. The source electrode 150 is connected with one end area of the active layer 126 via the first contact hole (CH1), and the drain electrode 160 is connected with the other end area of the active layer 126 via the second contact hole (CH2).

Also, a third contact hole (CH3) for exposing the light shielding layer 110 is provided in the buffer layer 125 and the insulating interlayer 140. The source electrode 150 is connected with the light shielding layer 110 via the third contact hole (CH3). The light shielding layer 110 is formed of a conductive material. If the light shielding layer 110 is in a floating state, it may have a bad influence on the active layer 126. According to the light shielding layer 110 being connected with the source electrode 150, it is possible to reduce or prevent the bad influence on the active layer 126. If needed, the light shielding layer 110 may be connected with the drain electrode 160.

Also, a fourth contact hole (CH4) for exposing the low-voltage line (VSS) 120 is provided in the buffer layer 125 and the insulating interlayer 140, and the auxiliary electrode 170 is connected with the low-voltage line (VSS) 120 via the fourth contact hole (CH4). The auxiliary electrode 170 functions as a connection electrode for connecting the cathode electrode 220 with the low-voltage line (VSS) 120. According to one embodiment of the present invention, a resistance of the cathode electrode 220 may be lowered by the low-voltage line (VSS) 120 and the auxiliary electrode 170.

The source electrode 150, the drain electrode 160, and the auxiliary electrode 170 may be provided in the same layer, and may be formed of the same material. In this instance, the source electrode 150, the drain electrode 160, and the auxiliary electrode 170 may be manufactured at the same time by the same process.

The source electrode 150 may include a lower source electrode 151, an upper source electrode 152, and a cover source electrode 153. The drain electrode 160 may include a lower drain electrode 161, an upper drain electrode 162, and a cover drain electrode 163. The auxiliary electrode 170 may include a lower auxiliary electrode 171, an upper auxiliary electrode 172, and a cover auxiliary electrode 173.

The lower source electrode 151, the lower drain electrode 161, and the lower auxiliary electrode 171 may be formed of the same material. The upper source electrode 152, the upper drain electrode 162, and the upper auxiliary electrode 172 may be formed of the same material. The cover source electrode 153, the cover drain electrode 163, and the cover auxiliary electrode 173 may be formed of the same material.

The lower source electrode 151 prevents a lower surface of the upper source electrode 152 from being corroded. The lower drain electrode 161 prevents a lower surface of the upper drain electrode 162 from being corroded. The lower auxiliary electrode 171 prevents a lower surface of the upper auxiliary electrode 172 from being corroded. Accordingly, an oxidation degree in each of the lower source electrode 151, the lower drain electrode 161, and the lower auxiliary electrode 171 is lower than an oxidation degree in each of the upper source electrode 152, the upper drain electrode 162, and the upper auxiliary electrode 172. Also, a corrosion resistance in each of the lower source electrode 151, the lower drain electrode 161, and the lower auxiliary electrode 171 is superior to a corrosion resistance in each of the upper source electrode 152, the upper drain electrode 162, and the upper auxiliary electrode 172. For example, the lower source electrode 151, the lower drain electrode 161, and the lower auxiliary electrode 171 may be formed of an alloy (MoTi) of molybdenum and titanium, but are not limited to these materials.

The cover source electrode 153 prevents an upper surface of the upper source electrode 152 from being corroded. The cover drain electrode 163 prevents an upper surface of the upper drain electrode 162 from being corroded. The cover auxiliary electrode 173 prevents an upper surface of the upper auxiliary electrode 172 from being corroded. Accordingly, an oxidation degree in each of the cover source electrode 153, the cover drain electrode 163, and the cover auxiliary electrode 173 is lower than an oxidation degree in each of the upper source electrode 152, the upper drain electrode 162, and the upper auxiliary electrode 172. Also, a corrosion resistance in each of the cover source electrode 153, the cover drain electrode 163, and the cover auxiliary electrode 173 is superior to a corrosion resistance in each of the upper source electrode 152, the upper drain electrode 162, and the upper auxiliary electrode 172. For example, the cover source electrode 153, the cover drain electrode 163, and the cover auxiliary electrode 173 may be formed of a transparent conductive material such as ITO (Indium Tin Oxide), but are not limited to this material.

A resistance in a material for the upper source electrode 152, the upper drain electrode 162, and the upper auxiliary electrode 172 may be lower than a resistance in a material for the lower source electrode 151, the cover source electrode 153, the lower drain electrode 161, the cover drain electrode 163, the lower auxiliary electrode, and the cover auxiliary electrode 173. For example, the upper source electrode 152, the upper drain electrode 162, and the upper auxiliary electrode 172 may be formed of a metal material such as copper (Cu), but are not limited to this material.

In order to lower a total resistance of the source electrode 150, a thickness of the upper source electrode 152 is larger than a thickness of each of the lower source electrode 151 and the cover source electrode 153, preferably, but such is not required. In the same manner, a thickness of the upper drain electrode 162 is larger than a thickness of each of the lower drain electrode 161 and the cover drain electrode 163, preferably, but such is not required. Also, a thickness of the upper auxiliary electrode 172 is larger than a thickness of each of the lower auxiliary electrode 171 and the cover auxiliary electrode 173, preferably, but such is not required.

A structure of the thin film transistor layer is not limited to the above structure, that is, a structure of the thin film transistor layer may be changed to various shapes generally known to those in the art. For example, the drawing shows a top gate structure where the gate electrode 130 is provided on the active layer 110, but not necessarily. That is, it is possible to provide a bottom gate structure where the gate electrode 130 is provided below the active layer 110.

A passivation layer 175 is provided on the source electrode 150, the drain electrode 160, and the auxiliary electrode 170, and then a planarization layer 178 is provided on the passivation layer 175. The passivation layer 175 protects the thin film transistor, and the passivation layer 175 extends from the active area (AA) to the pad area (PA). The passivation layer 175 is formed of an inorganic insulating material, for example, a silicon oxide film ($SiO_x$) or a silicon nitride film (SiNx), but is not limited to those.

The planarization layer 178 is provided to planarize an upper surface of the substrate 100 with the thin film transistor. The planarization layer 178 may be formed of an organic insulating material, for example, acryl resin, epoxy resin, phenolic resin, polyamide resin, polyimide resin, and etc., but is not limited to these materials. An anode electrode 180 and an eave structure 190 are provided on the planarization layer 178.

A fifth contact hole (CH5) for exposing the source electrode 150 is provided in the passivation layer 175 and the planarization layer 178, and the anode electrode 180 is connected with the source electrode 150 via the fifth contact hole (CH5). According to a driving mode, the fifth contact hole (CH5) may expose the drain electrode 160, and the anode electrode 180 may be connected with the drain electrode 160.

Also, a sixth contact hole (CH6) for exposing the auxiliary electrode 170 is provided in the passivation layer 175 and the planarization layer 178. The eave structure 190 extends to the inside of the sixth contact hole (CH6), wherein one end of the eave structure 190 protrudes to be parallel to the boundary surface between the passivation layer 175 and the planarization layer 178. In more detail, a lower surface of one end (a first part) of the eave structure 190 is provided at the same height as the boundary surface between the passivation layer 175 and the planarization layer 178. That is, the eave structure 190 (a second part) extends along a lateral surface of the planarization layer 178 provided inside the sixth contact hole (CH6), however, the eave structure 190 does not extend along a lateral surface of the passivation layer 175 provided inside the sixth contact hole (CH6), whereby it is possible to prepare a contact space (C) under one end of the eave structure 190. In embodiments of the present invention, a lower surface of the first part may be coplanar with the boundary surface between the passivation layer 175 and the planarization layer 178.

The anode electrode 180 and the eave structure 190 (a third part on the planarization layer 178) may be provided in the same layer, and may be formed of the same material. In this instance, the anode electrode 180 and the eave structure 190 may be manufactured at the same time by the same process, but not necessarily. It is possible to form the eave structure 190 directly on the passivation layer 175 by removing the planarization layer 178 under the eave structure 190. In embodiments of the present invention, the contact space (C) is between the auxiliary electrode 170 and the first part of the eave structure 190.

The anode electrode 180 may include a lower anode electrode 181, an upper anode electrode 182, and a cover anode electrode 183. The eave structure 190 may include a lower eave structure 191, an upper eave structure 192, and a cover eave structure 193. The lower anode electrode 181 and the lower eave structure 191 may be formed of the same material, the upper anode electrode 182 and the upper eave structure 192 may be formed of the same material, and the cover anode electrode 183 and the cover eave structure 193 may be formed of the same material.

The lower anode electrode 181 enhances an adhesive structure between the planarization layer 178 and the upper anode electrode 182, and the lower anode electrode 181 prevents a lower surface of the upper anode electrode 182 from being corroded. In the same manner, the lower eave structure 191 enhances an adhesive strength between the planarization layer 178 and the upper eave structure 192, and the lower eave structure 191 prevents a lower surface of the upper eave structure 192 from being corroded. Accordingly, an oxidation degree in each of the lower anode electrode 181 and the lower eave structure 191 may be lower than an oxidation degree in each of the upper anode electrode 182 and the upper eave structure 192, and a corrosion resistance in each of the lower anode electrode 181 and the lower eave structure 191 may be superior to a corrosion resistance in each of the upper anode electrode 182 and the upper eave structure 192. For example, the lower anode electrode 181 and the lower eave structure 191 may be formed of an alloy (MoTi) of molybdenum and titanium, but are not limited to these materials.

The upper anode electrode 182 is provided between the lower anode electrode 181 and the cover anode electrode 183, and the upper eave structure 192 is provided between the lower eave structure 191 and the cover eave structure 193. A resistance in a material for the upper anode electrode 182 and the upper eave structure 192 may be lower than a resistance in a material for the lower anode electrode 181, the cover anode electrode 183, the lower eave structure 191, and the cover eave structure 193. For example, the upper anode electrode 182 and the upper eave structure 192 may be formed of a metal material such as silver (Ag), but are not limited to this material.

In order to lower a total resistance of the anode electrode 180, a thickness of the upper anode electrode 182 is larger than a thickness of each of the lower anode electrode 181 and the cover anode electrode 183, preferably, but such is not required. The cover anode electrode 183 prevents a corrosion of the upper anode electrode 182. In the same manner, the cover eave structure 193 prevents a corrosion of the upper eave structure 192.

An oxidation degree in each of the cover anode electrode 183 and the cover eave structure 193 may be lower than an oxidation degree in each of the upper anode electrode 182 and the upper eave structure 192, and a corrosion resistance in each of the cover anode electrode 183 and the cover eave structure 193 may be superior to a corrosion resistance in each of the upper anode electrode 182 and the upper eave structure 192. For example, the cover anode electrode 183 and the cover eave structure 193 may be formed of a transparent conductive material such as ITO (Indium Tin Oxide), but are not limited to this material.

Meanwhile, a middle anode electrode of a transparent conductive material such as ITO (Indium Tin Oxide) may be additionally provided between the lower anode electrode 181 and the upper anode electrode 182, whereby the anode electrode 180 may be formed in a four-layered structure. In the same manner, a middle eave structure of a transparent conductive material such as ITO (Indium Tin Oxide) may be additionally provided between the lower eave structure 191 and the upper eave structure 192, whereby the eave structure 190 may be formed in a four-layered structure.

A bank layer 200a, 200b, and 200c is provided on the anode electrode 180 and the eave structure 190, wherein a pixel region is defined by the bank layer 200a, 200b, and 200c. The bank layer 200a, 200b, and 200c may include a first bank 200a, a second bank 200b, and a third bank 200c.

The first bank 200a covers one end of the anode electrode 180, and the second bank 200b covers the other end of the anode electrode 180. In an area between the first bank 200a and the second bank 200b, an upper surface of the anode electrode 180 is exposed, and light is emitted in the area of the upper surface of the exposed anode electrode 180, to thereby display an image.

The second bank 200b extends to the inside of the sixth contact hole (CH6). In more detail, the second bank 200b may extend along a lateral surface of the planarization layer 178 provided inside the sixth contact hole (CH6). According to some of the second bank 200b extending to the area of the sixth contact hole (CH6), the cathode electrode 220 may be easily connected with the auxiliary electrode 170 along the extending second bank 200b. That is, as shown in the drawings, if some of the second bank 200b extends to the area of the sixth contact hole (CH6), an organic emitting layer 210 and the cathode electrode 220 may be sequentially deposited on the upper surface of the extending second bank 200b, whereby the cathode electrode 200 may be contacted to the upper surface of the auxiliary electrode 170 with ease. If the second bank 200b does not extend to the area of the sixth contact hole (CH6), it has a possibility of disconnection in the cathode electrode 220 extending to the area of the sixth contact hole (CH6).

In the drawings, the second bank 200b extends only to the upper surface of the passivation layer 175 inside the sixth contact hole (CH6), and does not extend to the lateral surface of the passivation layer 175, but is not limited to this structure. The second bank 200b may extend along the lateral surface of the passivation layer 175 inside the sixth contact hole (CH6), and may extend to some area of the upper surface of the auxiliary electrode 170.

The third bank 200c is provided on the eave structure 190. The bank layer 200a, 200b, and 200c may be formed of an organic insulating material, for example, polyimide resin, acryl resin, benzocyclobutene BCB, and etc., but is not limited to these materials.

The organic emitting layer 210 is provided on the bank layer 200a, 200b, and 200c, and the cathode electrode 220 is provided on the organic emitting layer 210. The organic emitting layer 210 is brought into contact with the anode electrode 180 in the area between the first bank 200a and the second 200b. Also, while the organic emitting layer 210 extends to the area of the sixth contact hole (CH6) along the second bank 200b, the organic emitting layer 210 is brought into contact with some area of the upper surface of the auxiliary electrode 170. Thus, it facilitates the contact between the cathode electrode 220 and the upper surface of the auxiliary electrode 170.

In this instance, the organic emitting layer 210 is not provided in the contact space (C) under the eave structure 190. Thus, the upper surface of the auxiliary electrode 170 is exposed in the contact space (C). The organic emitting layer 210 may be manufactured by a deposition process using a deposition material with superior straightness, for example, an evaporation process. Thus, the organic emitting layer 210 is not deposited in the contact space (C) under the eave structure 190 for the deposition process of the organic emitting layer 210.

The organic emitting layer 201 may include a hole injecting layer, a hole transporting layer, an emitting layer, an electron transporting layer, and an electron injecting layer. A structure of the organic emitting layer 210 may be changed to various shapes generally known to those in the art.

The cathode electrode 220 is provided in a light-emission surface, whereby the cathode electrode 220 is formed of a transparent conductive material with a high resistance. In order to lower a resistance of the cathode electrode 220, the cathode electrode is connected with the auxiliary electrode 170. In more detail, the cathode electrode 220 extends to the area of the sixth contact hole (CH6). Especially, the cathode electrode 220 extends to the inside of the contact space (C), and the extending cathode electrode 220 is brought into contact with the exposed upper surface of the auxiliary electrode 170. The cathode electrode 220 may be manufactured by a deposition method using a deposition material with inferior straightness, for example, a sputtering process. Thus, the cathode electrode 220 may be deposited in the contact space (C) for the deposition process of the cathode electrode 220.

According to one embodiment of the present invention, the cathode electrode 220 is electrically connected with the auxiliary electrode 170 in the contact space (C) under the eave structure 190, whereby there is no need for a related art reverse-tapered partition structure. That is, it is possible to overcome problems related with collapse or peeling-off of the partition.

An encapsulation layer for preventing a permeation of moisture may be additionally provided on the cathode electrode 220. The encapsulation layer may be filled in the contact space (C). The encapsulation layer may be formed of various materials generally known to those in the art.

An opposite substrate provided with a color filter for each pixel may be additionally provided on the cathode electrode 220. In this instance, white light may be emitted from the organic emitting layer 210.

A structure of the pad area (PA) on the substrate 100 will be described in detail as follows.

A buffer layer 125 is provided on the substrate 100, a gate insulating film 127 is provided on the buffer layer 125, a signal pad 300 is provided on the gate insulating film 127, an insulating interlayer 140 is provided on the signal pad 300, a first pad electrode 400 is provided on the insulating interlayer 140, and a passivation layer 175 is provided on the first pad electrode 400.

The buffer layer 125 extends from the active area (AA).

The gate insulating film 127 in the pad area (PA) corresponds to the gate insulating film 127 provided on a lower surface of a gate electrode 130 in the active area (AA). The gate insulating film 127 and the signal pad 300 may have the same pattern.

The signal pad 300 may be formed of the same material as that of the gate electrode 130 in the active area (AA). In this instance, the signal pad 300 and the gate electrode 130 may be manufactured at the same time by the same process.

The signal pad 300 may include a lower signal pad 301 and an upper signal pad 302. The lower signal pad 301 is formed of the same material as that of the aforementioned lower gate electrode 131, and the lower signal pad 301 prevents a corrosion of the upper signal pad 302. The upper signal pad 302 is formed of the same material as that of the aforementioned upper gate electrode 132, and the upper signal pad 302 lowers a resistance of the signal pad 300. In order to lower a total resistance of the signal pad 300, a thickness of the upper signal pad 302 is larger than a thickness of the lower signal pad 301, preferably, but such is not required.

The insulating interlayer 140 extends from the active area (AA). A seventh contact hole (CH7) is provided in the insulating interlayer 140, and the signal pad 300 is exposed via the seventh contact hole (CH7).

The first pad electrode 400 is connected with the signal pad 300 via the seventh contact hole (CH7). A material for the first pad electrode 400 may be the same as those of the source electrode 150, the drain electrode 160, and the auxiliary electrode 170 in the active area (AA). In this instance, the first pad electrode 400, the source electrode 150, the drain electrode 160, and the auxiliary electrode 170 may be manufactured at the same time by the same process.

The first pad electrode 400 may include a lower first pad electrode 401, an upper first pad electrode 402, and a cover first pad electrode 403. The lower first pad electrode 401 may be formed of the same material as those of the lower source electrode 151, the lower drain electrode 161, and the lower auxiliary electrode 171 in the aforementioned active area (AA). The upper first pad electrode 402 may be formed of the same material as those of the upper source electrode 152, the upper drain electrode 162, and the upper auxiliary electrode 172 in the aforementioned active area (AA). The cover first pad electrode 403 may be formed of the same material as those of the cover source electrode 153, the cover drain electrode 163, and the cover auxiliary electrode 173 in the aforementioned active area (AA). The lower first pad electrode 401 prevents a corrosion of the upper first pad electrode 402, and also prevents a corrosion of the upper signal pad 302.

The upper first pad electrode 402 lowers a resistance of the first pad electrode 400. In order to lower a total resistance of the first pad electrode 400, a thickness of the upper first pad electrode 402 is larger than a thickness of each of the lower first pad electrode 401 and the cover first pad electrode 403, preferably, but such is not required. The cover first pad electrode 403 prevents a corrosion of the upper first pad electrode 402.

The passivation layer 175 extends from the active area (AA). An eighth contact hole (CH8) is provided in the passivation layer 175, and the first pad electrode 400 is exposed to the outside via the eighth contact hole (CH8).

In this instance, a lateral surface of the first pad electrode 400 is covered by the passivation layer 175 so that it is possible to prevent the lateral surface of the first pad electrode 400 from being corroded. Also, even though an upper surface of the first pad electrode 400 is exposed to the outside, the cover first pad electrode 403 with good corrosion resistance is exposed to the outside so that it is possible to prevent a corrosion in the upper surface of the first pad electrode 400.

As shown in FIG. 2B, the active area (AA) and the pad area (PA) are prepared on the substrate 100, and the low-voltage line (VSS) 120 extends from the pad area (PA) to the active area (AA).

The low-voltage line (VSS) 120 is connected with the auxiliary electrode 170 via the fourth contact hole (CH4), and the auxiliary electrode 170 is connected with the cathode electrode 220 inside the sixth contact hole (CH6). The cathode electrode 220 is formed in the entire active area (AA).

The fourth contact hole (CH4) and the sixth contact hole (CH6) may be provided every individual pixel, but are not limited to this structure.

Figure 3:
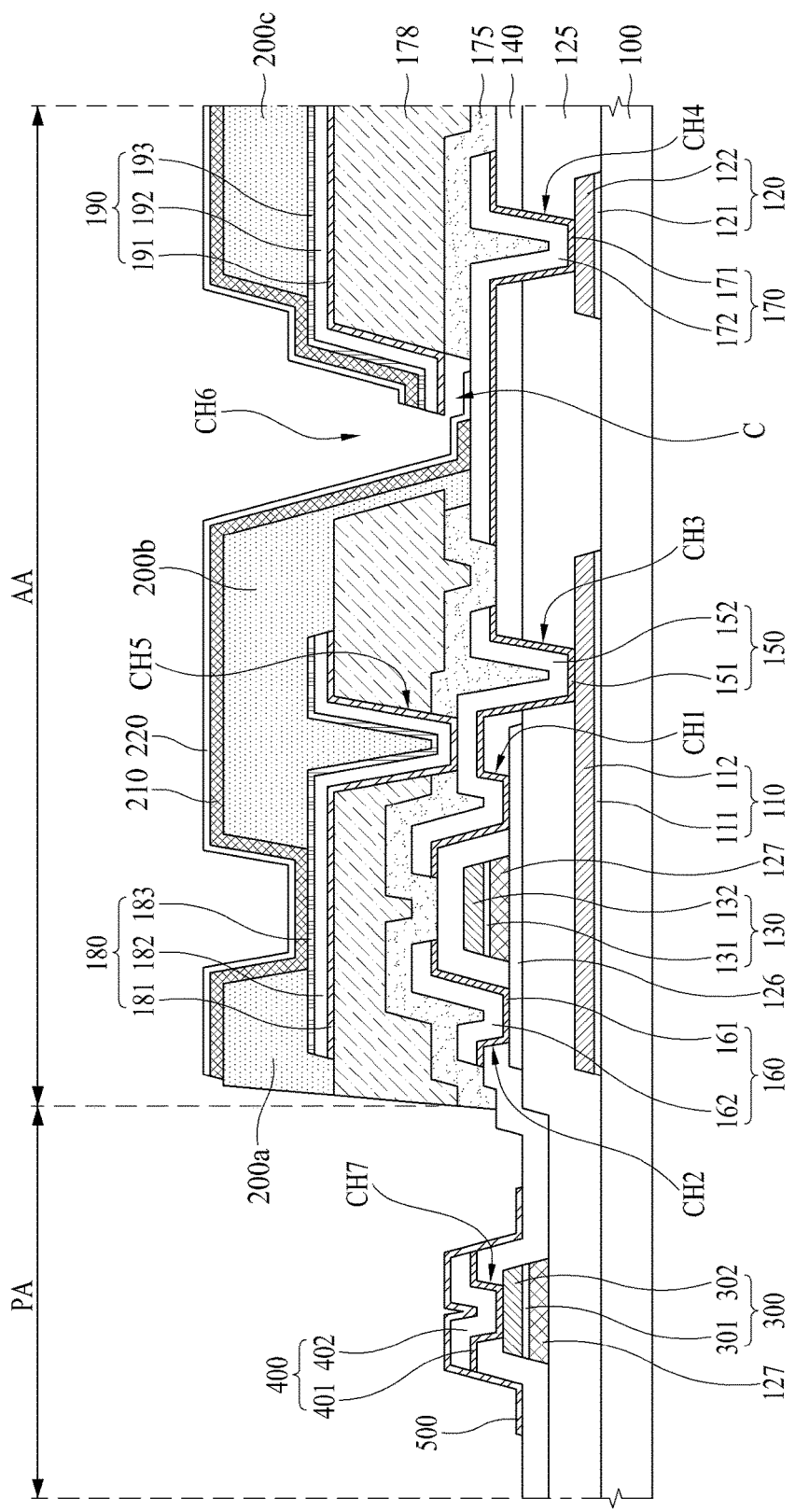
FIG. 3 is a cross sectional view illustrating an OLED device according to another embodiment of the present invention.

FIG. 3 is a cross sectional view illustrating an organic light emitting display (OLED) device according to another embodiment of the present invention. A structure of a pad area (PA), a structure of a sixth contact hole (CH6) area, a first pad electrode 400, a source electrode 150, a drain electrode 160, and an auxiliary electrode 170 in the organic light emitting display device, shown in FIG. 3, according to another embodiment of the present invention are different from those in the organic light emitting display device shown in FIG. 2. Thus, the same reference numbers will be used throughout the drawings to refer to the same or like parts. Hereinafter, the pad area (PA) will be described in detail as follows.

As shown in FIG. 3, a buffer layer 125 is provided on the pad area (PA) of a substrate 100, a gate insulating film 127 is provided on the buffer layer 125, a signal pad 300 is provided on the gate insulating film 127, an insulating interlayer 140 is provided on the signal pad 300, a first pad electrode 400 is provided on the insulating interlayer 140, and a second pad electrode 500 is provided on the first pad electrode 400, wherein the first pad electrode 400 is connected with the signal pad 300 via a seventh contact hole (CH7).

The organic light emitting display device, shown in FIG. 3, according to another embodiment of the present invention is different from the aforementioned organic light emitting display device shown in FIG. 2 in that a passivation layer 175 is not provided on the first pad electrode 400. In the instance of the organic light emitting display device, shown in FIG. 3, according to another embodiment of the present invention, the second pad electrode 500 is provided on the first pad electrode 400.

The second pad electrode 500 covers upper and lateral surfaces of the first pad electrode 400, to thereby prevent a corrosion of the first pad electrode 400. That is, an upper first pad electrode 402 is covered by the second pad electrode 500. Unlike the aforementioned organic light emitting display device shown in FIG. 2, the organic light emitting display device shown in FIG. 3 includes the first pad electrode 400 having a lower first pad electrode 401 and the upper first pad electrode 402. In the organic light emitting display device shown in FIG. 3, there is no need for an additional cover first pad electrode 403 on the upper first pad electrode 402. Accordingly, the source electrode 150 includes a lower source electrode 151 and an upper source electrode 152, the drain electrode 160 includes a lower drain electrode 161 and an upper drain electrode 162, and the auxiliary electrode 170 includes a lower auxiliary electrode 171 and an upper auxiliary electrode 172.

The second pad electrode 500 may be formed of the same material as those of the lower anode electrode 181 and the lower eave structure 191 in the aforementioned active area (AA). Accordingly, the second pad electrode 500, the lower anode electrode 181, and the lower eave structure 191 may be manufactured at the same time by the same process.

Also, referring to FIG. 3, a second bank 200b may extend to an upper surface of the auxiliary electrode 170 along lateral surfaces of a passivation layer 175 and a planarization layer 178 inside the aforementioned sixth contact hole (CH6). Accordingly, an organic emitting layer 210 may extend to the inside of the sixth contact hole (CH6) along the second bank 200b, and further extend to the upper surface of the auxiliary electrode 170. As a result, a cathode electrode 200 extends to the inside of the sixth contact hole (CH6) along the organic emitting layer 210, whereby the cathode electrode 200 is connected with the auxiliary electrode 170 in a contact space (C).

Figure 4:
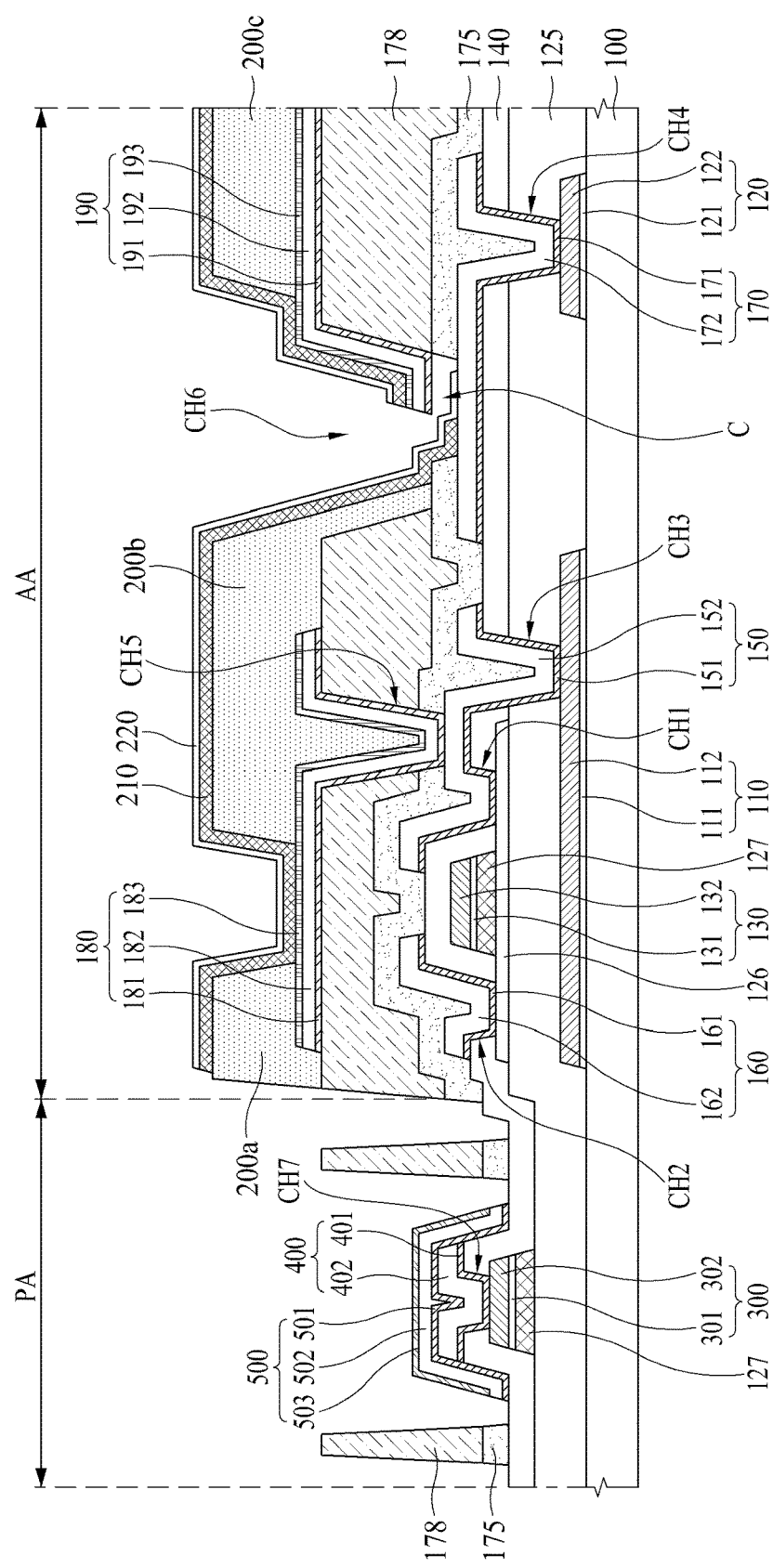
FIG. 4 is a cross sectional view illustrating an OLED device according to another embodiment of the present invention.

FIG. 4 is a cross sectional view illustrating an organic light emitting display device according to another embodiment of the present invention. A structure of a pad area (PA), a first pad electrode 400, a source electrode 150, a drain electrode 160, and an auxiliary electrode 170 in the organic light emitting display device, shown in FIG. 4, according to another embodiment of the present invention are different from those in the organic light emitting display device shown in FIG. 2. Thus, the same reference numbers will be used throughout the drawings to refer to the same or like parts. Hereinafter, the pad area (PA) will be described in detail as follows.

As shown in FIG. 4, a buffer layer 125 is provided on the pad area (PA) of a substrate 100, a gate insulating film 127 is provided on the buffer layer 125, a signal pad 300 is provided on the gate insulating film 127, an insulating interlayer 140 is provided on the signal pad 300, a first pad electrode 400 is provided on the insulating interlayer 140, and a second pad electrode 500 is provided on the first pad electrode 400, wherein the first pad electrode 400 is connected with the signal pad 300 via a seventh contact hole (CH7).

The organic light emitting display device, shown in FIG. 4, according to another embodiment of the present invention is different from the aforementioned organic light emitting display device shown in FIG. 2 in that a passivation layer 175 is not provided on the first pad electrode 400. In the instance of the organic light emitting display device, shown in FIG. 4, according to another embodiment of the present invention, the second pad electrode 500 is provided on the first pad electrode 400.

The second pad electrode 500 covers upper and lateral surfaces of the first pad electrode 400, to thereby prevent a corrosion of the first pad electrode 400. That is, an upper first pad electrode 402 is covered by the second pad electrode 500. Unlike the aforementioned organic light emitting display device shown in FIG. 2, the organic light emitting display device shown in FIG. 4 includes the first pad electrode 400 having a lower first pad electrode 401 and the upper first pad electrode 402. In the organic light emitting display device shown in FIG. 4, there is no need for an additional cover first pad electrode 403 on the upper first pad electrode 402. Accordingly, the source electrode 150 includes a lower source electrode 151 and an upper source electrode 152, the drain electrode 160 includes a lower drain electrode 161 and an upper drain electrode 162, and the auxiliary electrode 170 includes a lower auxiliary electrode 171 and an upper auxiliary electrode 172.

The second pad electrode 500 may be formed of the same material as those of the anode electrode 180 and the eave structure 190 in the aforementioned active area (AA).

Accordingly, the second pad electrode 500, the anode electrode 180, and the eave structure 190 may be manufactured at the same time by the same process.

The second pad electrode 500 may include a lower second pad electrode 501, an upper second pad electrode 502, and a cover second pad electrode 503. The lower second pad electrode 501 may be formed of the same material as those of a lower anode electrode 181 and a lower eave structure 191, the upper second pad electrode 502 may be formed of the same material as those of an upper anode electrode 182 and an upper eave structure 192, and the cover second pad electrode 503 may be formed of the same material as those of a cover anode electrode 183 and a cover eave structure 193.

Accordingly, an oxidation degree in each of the lower second pad electrode 501 and the cover second pad electrode 503 may be lower than an oxidation degree of the upper second pad electrode 502, and a corrosion resistance in each of the lower second pad electrode 501 and the cover second pad electrode 503 may be superior to a corrosion resistance of the upper second pad electrode 502. Also, a resistance in a material for the upper second pad electrode 502 may be lower than a resistance in a material for each of the lower second pad electrode 501 and the cover second pad electrode 503. Also, a thickness of the upper second pad electrode 502 may be larger than a thickness of each of the lower second pad electrode 501 and the cover second pad electrode 503.

Also, a passivation layer 175 and a planarization layer 178 may be sequentially provided on one side and the other side of each of the first pad electrode 400 and the second pad electrode 500 in the pad area (PA). The passivation layer 175 of the pad area (PA) is provided on the insulating interlayer 140, and the planarization layer 178 of the pad area (PA) is provided on the passivation layer 175. The passivation layer 175 and the planarization layer 178 provided in the pad area (PA) may be spaced apart from the first pad electrode 400 and the second pad electrode 500. In the instance of the passivation layer 175 and the planarization layer 178 provided in the pad area (PA), the planarization layer 178 is relatively thicker so as to prevent one end of the planarization layer 178 from being peeled-off for the manufacturing process, whereby the planarization layer 178 remains.

FIGS. 5A to 5G are cross sectional views illustrating a method of manufacturing the organic light emitting display device according one embodiment of the present invention, which relate to the method of manufacturing the organic light emitting display device shown in FIG. 2. Accordingly, the same reference numbers will be used throughout the drawings to refer to the same or like parts, and a detailed description for the material in each element and the structure will be omitted.

Figure 5A:
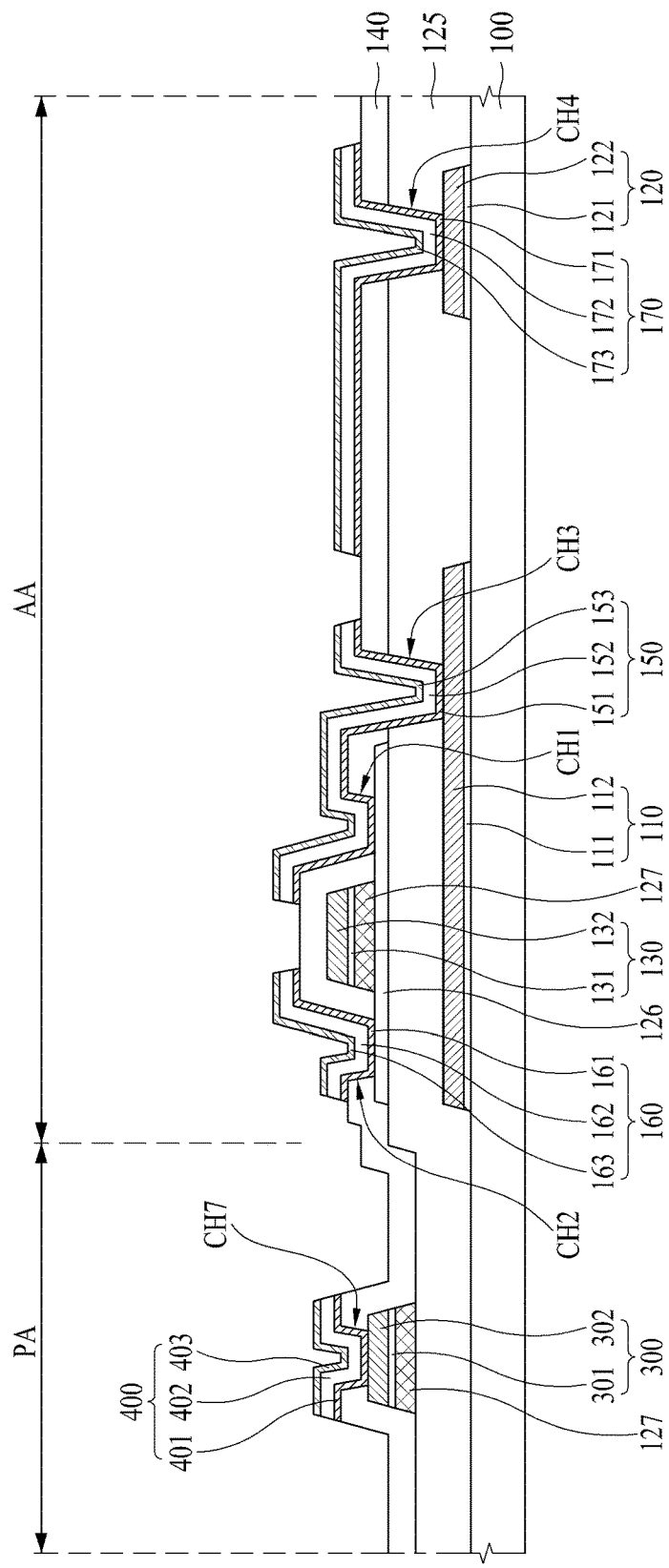
FIGS. 5A to 5G are cross sectional views illustrating a method of manufacturing the OLED device according one embodiment of the present invention, which relate to the method of manufacturing the OLED device shown in FIG. 2.

First, as shown in FIG. 5A, the light shielding layer 110 and the low-voltage line (VSS) 120 are patterned on the active area (AA) of the substrate 100, and the buffer layer 125 is provided on the light shielding layer 110 and the low-voltage line (VSS) 120. The buffer layer 125 is also provided on the pad area (PA).

After that, the active layer 126, the gate insulating film 127, and the gate electrode 130 are patterned on the active area (AA) of the buffer layer 125. At the same time, the gate insulating film 127 and the signal pad 300 are patterned on the pad area (AA) of the buffer layer 125.

The insulating interlayer 140 is provided on the gate electrode 130 and the signal pad 300. Also, the first contact hole (CH1) and the second contact hole (CH2) are provided in the insulating interlayer 140, to thereby expose one end and the other end of the active layer 126. Also, the third contact hole (CH3) and the fourth contact hole (CH4) are provided in the insulating interlayer 140 and the buffer layer 125, to thereby expose the light shielding layer 110 and the low-voltage line (VSS) 120. Also, the seventh contact hole (CH7) is provided in the insulating interlayer 140 of the pad area (PA), to thereby expose the signal pad 300.

Then, the source electrode 150 is patterned on the insulating interlayer 140, wherein the source electrode 150 is connected with the active layer 126 via the first contact hole (CH1), and is connected with the light shielding layer 110 via the third contact hole (CH3). The drain electrode 160 is patterned on the insulating interlayer 140, wherein the drain electrode 160 is connected with the active layer 126 via the second contact hole (CH2). Also, the auxiliary electrode 170 is patterned on the insulating interlayer 140, wherein the auxiliary electrode 170 is connected with the low-voltage line (VSS) 120 via the fourth contact hole (CH4). Also, the first pad electrode 400 is patterned on the insulating interlayer 140, wherein the first pad electrode 400 is connected with the signal pad 300 via the seventh contact hole (CH7).

Figure 5B:
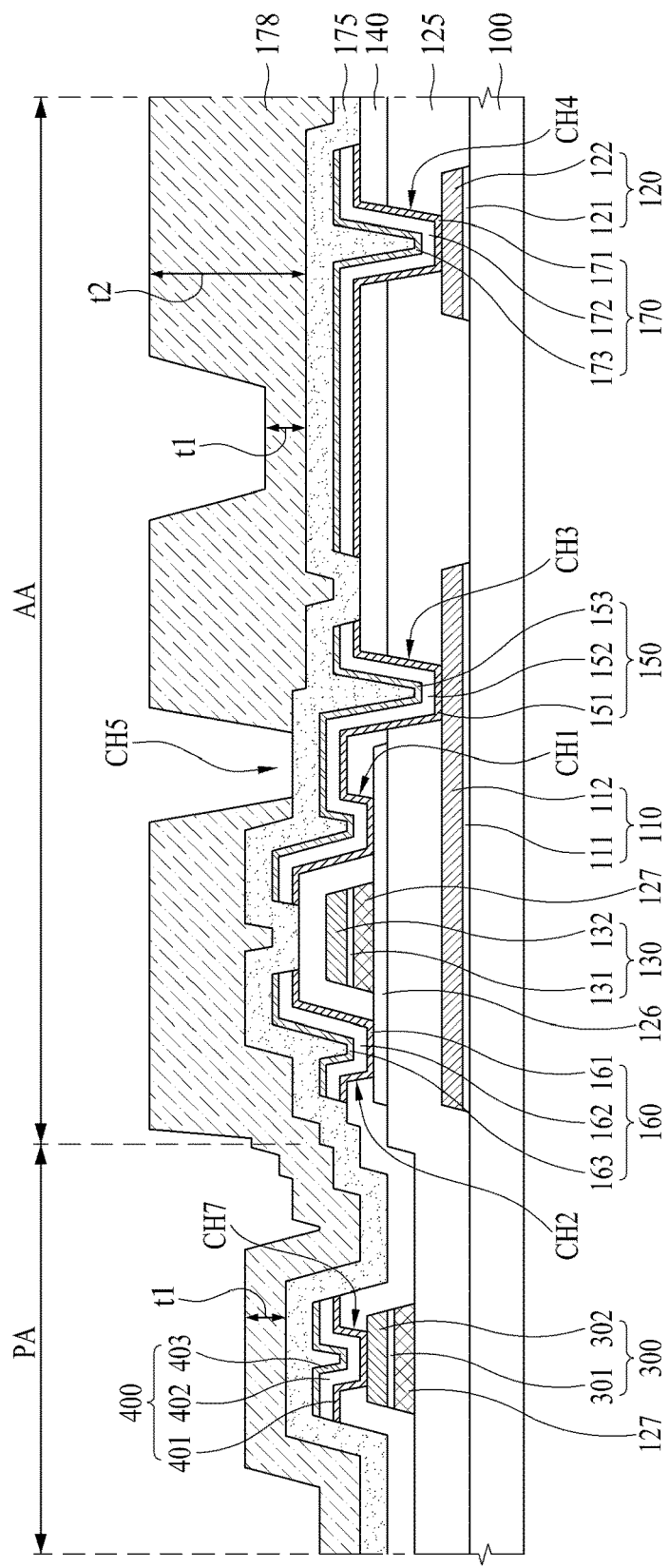

Then, as shown in FIG. 5B, the passivation layer 175 is provided on the source electrode 150, the drain electrode 160, the auxiliary electrode 170, and the first pad electrode 400, and the planarization layer 178 is patterned on the passivation layer 175.

The planarization layer 178 is not provided on some area of the source electrode 150. The planarization layer 178 is provided in such a manner that a thickness (t1) of the planarization layer 178 on some area of the auxiliary electrode 170 and the pad area (PA) is relatively small, and a thickness (t2) of the planarization layer 178 on the remaining areas is relatively large.

Figure 5C:
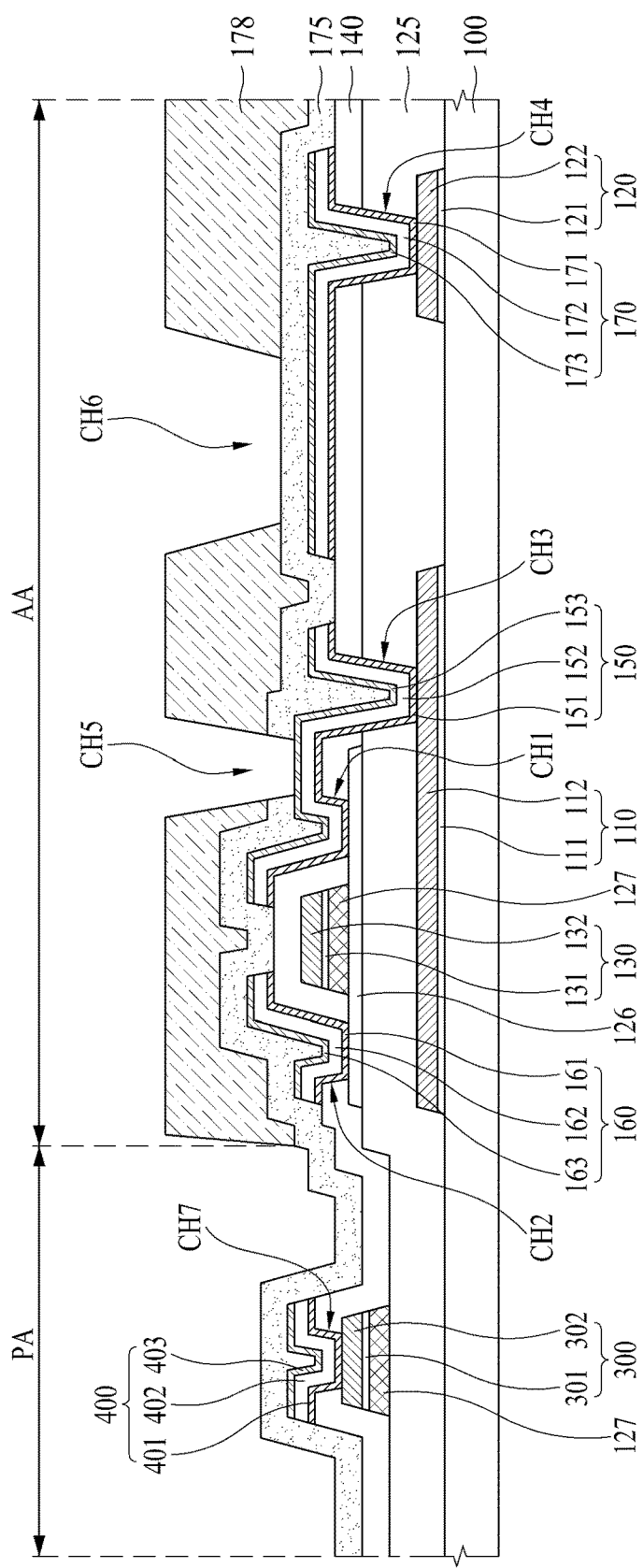

Then, as shown in FIG. 5C, the fifth contact hole (CH5) is formed by removing the passivation layer 175 on some area of the source electrode 150 under the condition the planarization layer 178 is used as a mask, whereby the source electrode 150 is exposed via the fifth contact hole (CH5).

By ashing the planarization layer 178, the planarization layer 178 remains only in the area with the relatively-large thickness (t2), and the planarization layer 178 is removed from the area with the relatively-small thickness (t1), to thereby expose the passivation layer 175 on the auxiliary electrode 170 and the pad area (PA). In this instance, the sixth contact hole (CH6) area is prepared by the planarization layer 178 which is partially removed from the area on the auxiliary electrode 170.

Figure 5D:
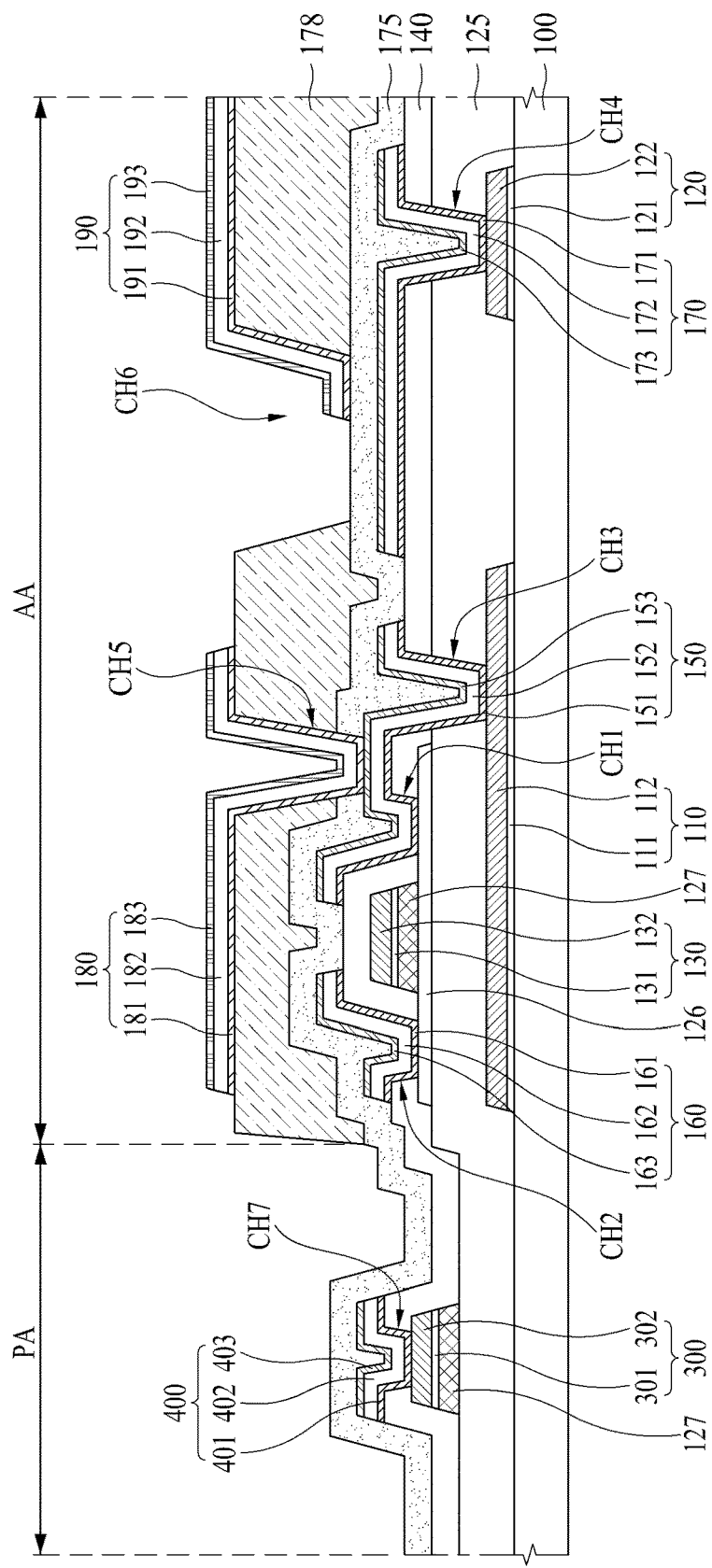

Then, as shown in FIG. 5D, the anode electrode 180 and the eave structure 190 are patterned on the planarization layer 178. The anode electrode 180 is patterned to be connected with the source electrode 150 via the fifth contact hole (CH5). The eave structure 190 extends to the sixth contact hole (CH6) area, and further extends to some area of the upper surface of the exposed passivation layer 175.

Figure 5E:
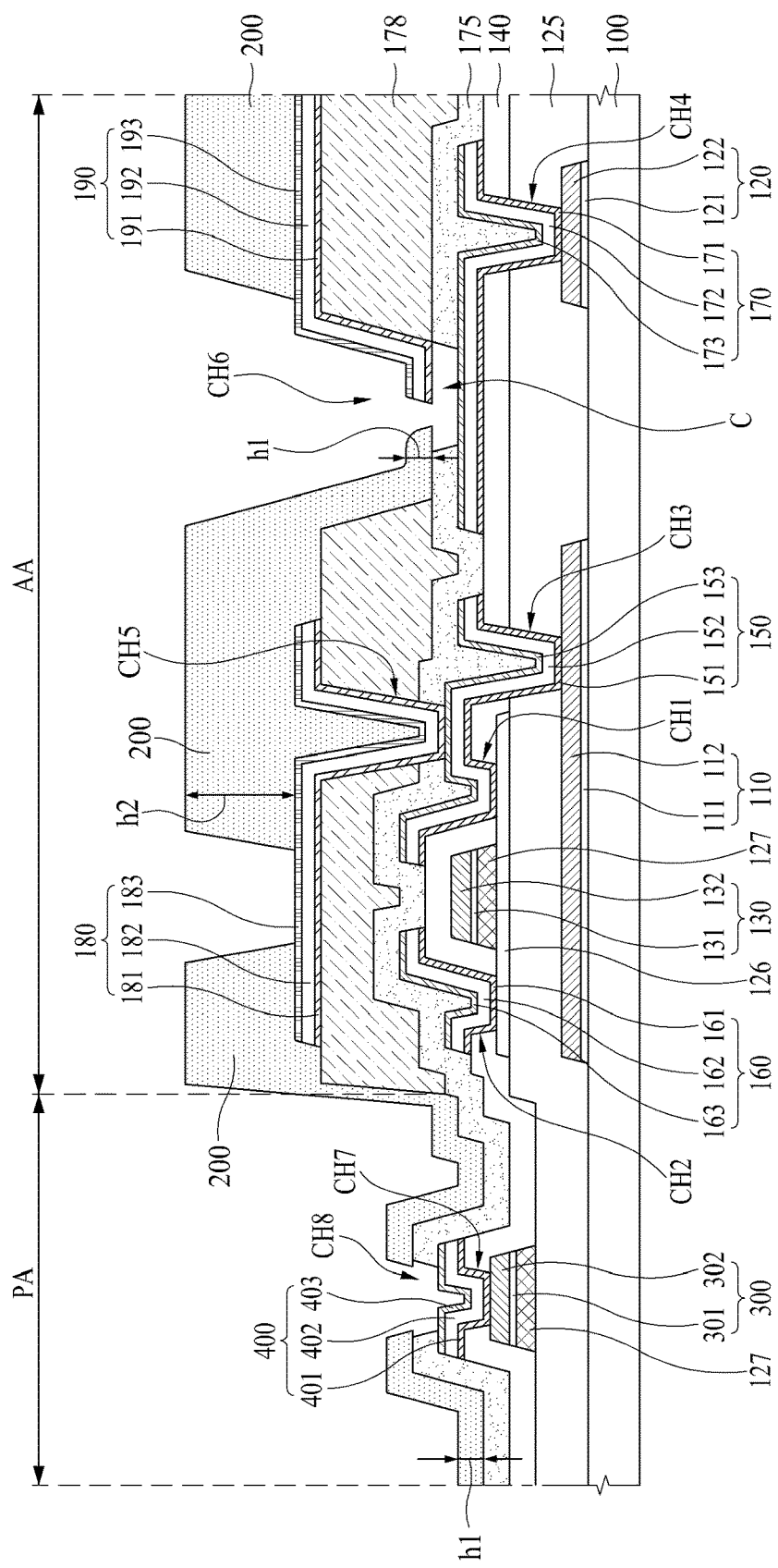

As shown in FIG. 5E, the bank layer 200 is provided on the anode electrode 180 and the eave structure 190. The bank layer 200 is provided on the active area (AA) and the pad area (PA). The bank layer 200 is not provided on some area of the first pad electrode 400, the pixel region of the anode electrode 180, and some area of the auxiliary electrode 170. The bank layer 200 is provided in such a manner that a thickness (h1) of the bank layer 200 in the pad area (PA) and the end area of the sixth contact hole (CH6) is relatively small, and a thickness (h2) of the bank layer 200 in the remaining areas is relatively large.

According to the passivation layer 175 being removed under the condition that the bank layer 200 is used as a mask, the first pad electrode 400 and the auxiliary electrode 170 are exposed. In this instance, the passivation layer 175 provided under the eave structure 190 is also removed, to thereby prepare the contact space (C). Also, the eighth contact hole (CH8) is formed on the first pad electrode 400.

Figure 5F:
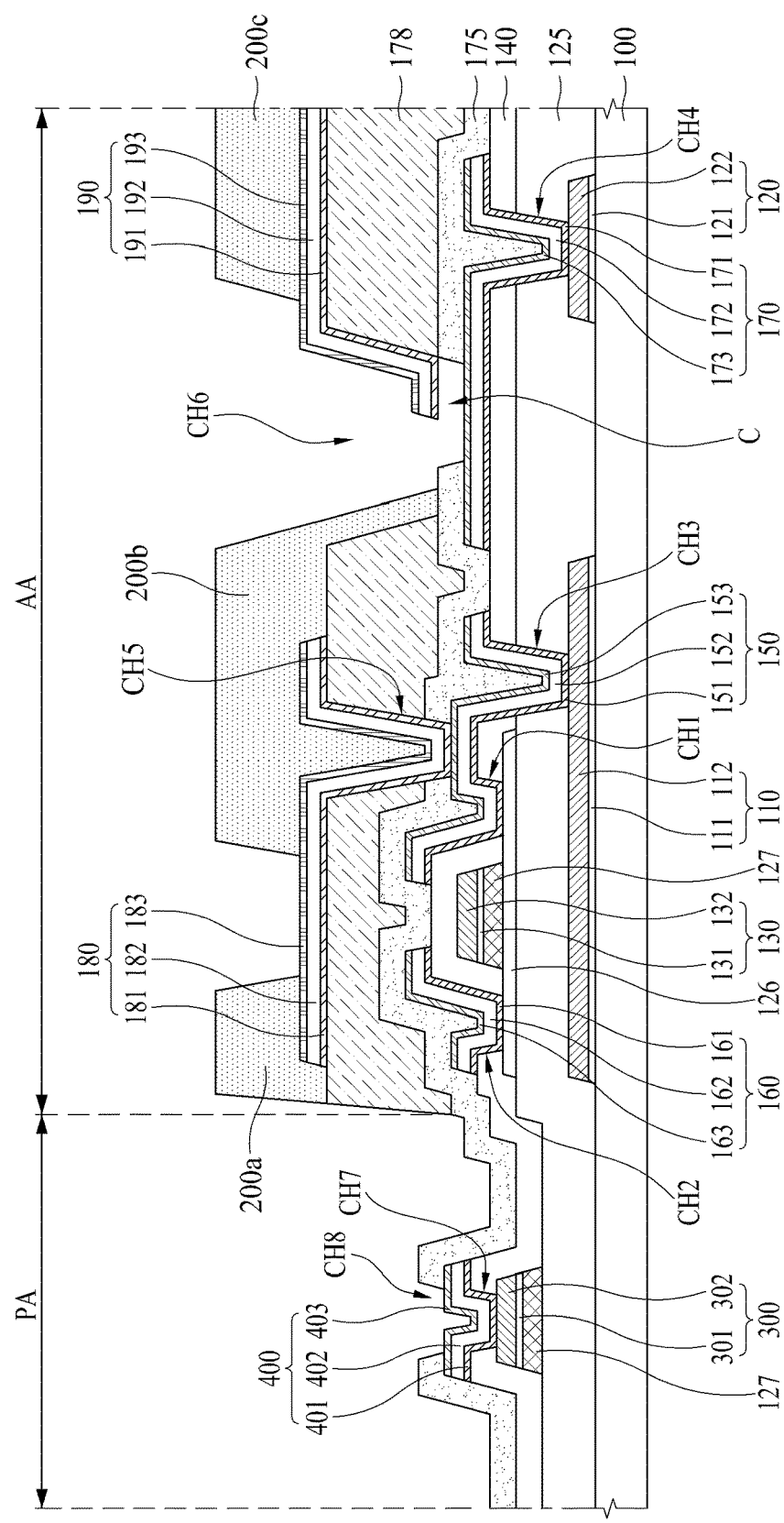

After that, as shown in FIG. 5F, the bank layer 200 is ashed so that the bank layer 200 with the relatively-small thickness (h1) is removed, and only the bank layer 200 with the relatively-large thickness (h2) remains, to thereby form the first bank 200*a*, the second bank 200*b*, and the third bank 200*c*.

Figure 5G:
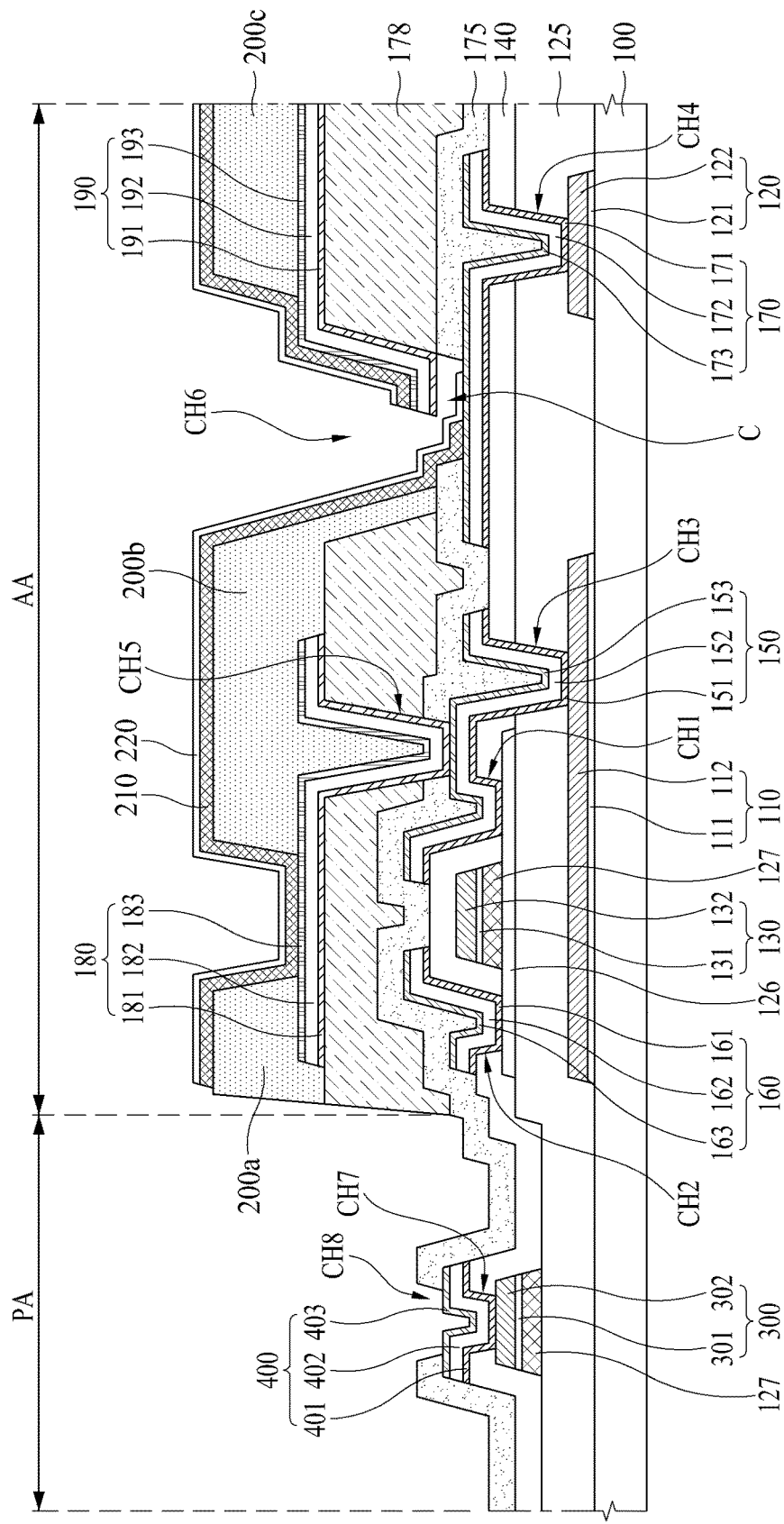

As shown in FIG. 5G, the organic emitting layer 210 is formed on the first bank 200*a*, the second bank 200*b*, and the third bank 200*c* in the active area (AA), and the cathode electrode 200 is formed on the organic emitting layer 210. The organic emitting layer 210 may be manufactured by the evaporation method using the deposition material with superior straightness. Thus, the organic emitting layer 210 is not deposited in the contact space (C) under the eave structure 190.

The cathode electrode 220 may be manufactured by the sputtering method using the deposition material with inferior straightness. Thus, the cathode electrode 220 may be deposited in the contact space (C). Accordingly, the cathode electrode 220 is connected with the auxiliary electrode 170 in the contact space (C).

FIGS. 6A to 6G are cross sectional views illustrating a method of manufacturing the organic light emitting display device according to another embodiment of the present invention, which relate to the method of manufacturing the organic light emitting display device shown in FIG. 3. Accordingly, the same reference numbers will be used throughout the drawings to refer to the same or like parts, and a detailed description for the material in each element and the structure will be omitted.

Figure 6A:
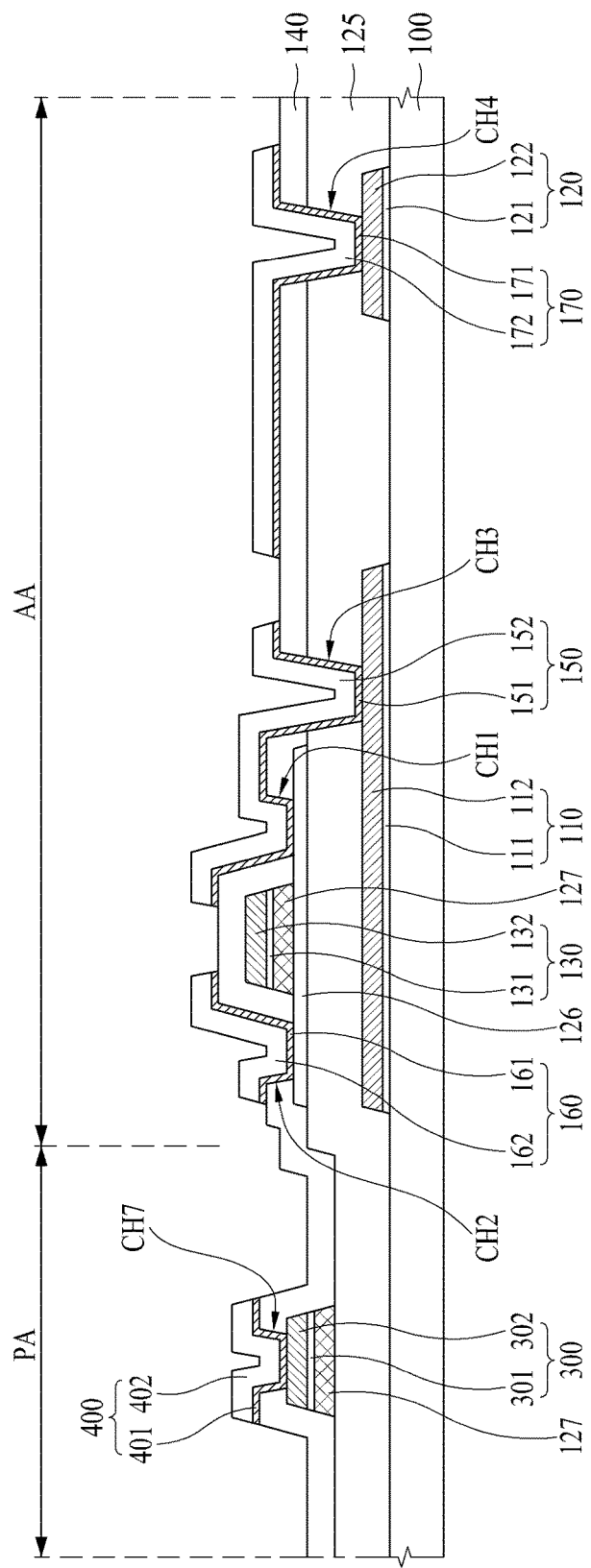
FIGS. 6A to 6G are cross sectional views illustrating a method of manufacturing the OLED device according another embodiment of the present invention, which relate to the method of manufacturing the OLED device shown in FIG. 3.
Figure 6B:
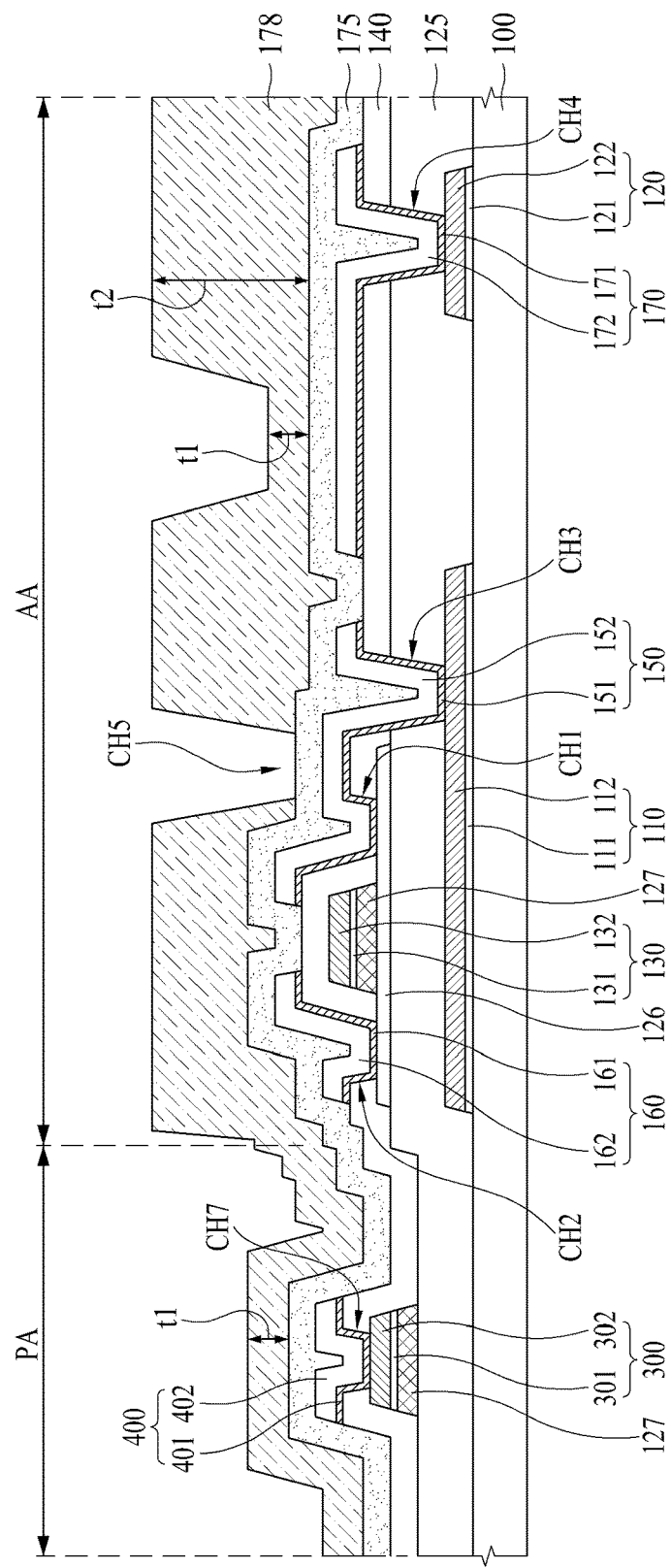
Figure 6C:
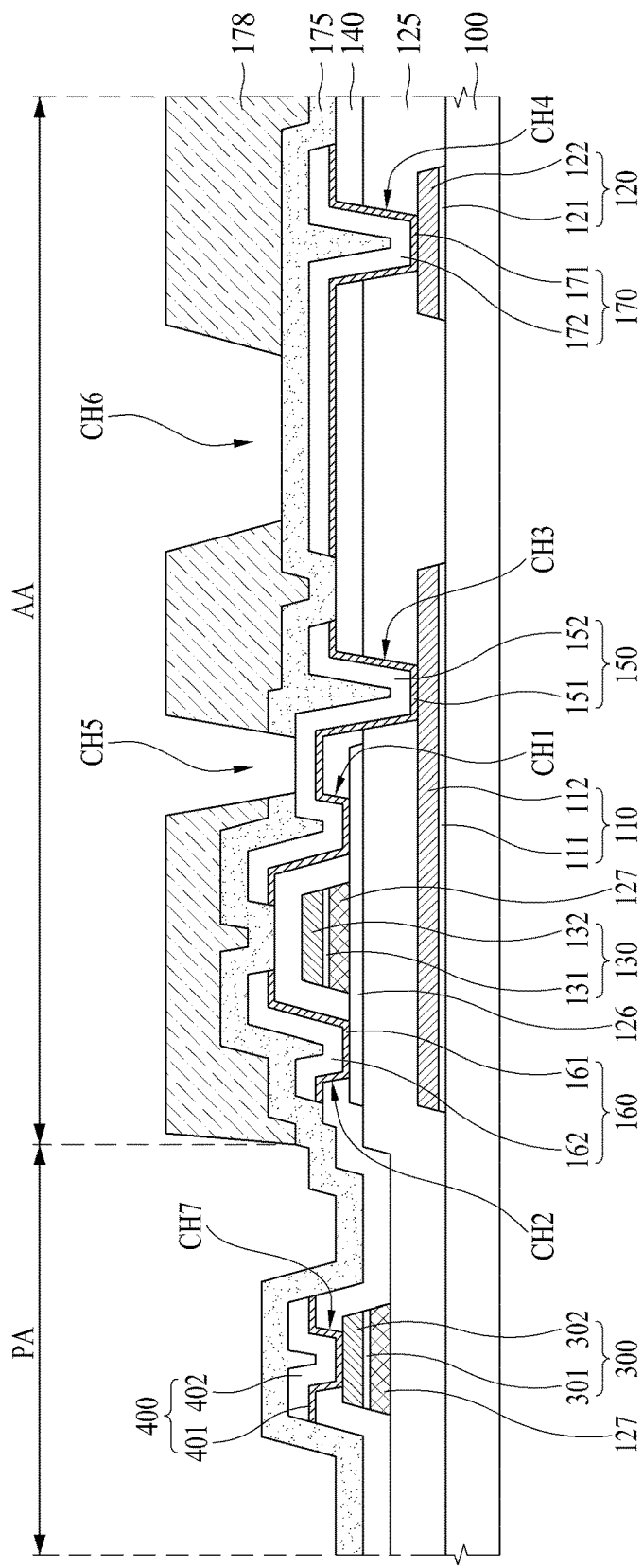

First, the processes of FIGS. 6A to 6C are the same as the processes of FIGS. 5A to 5C, whereby a detailed description for the processes of FIGS. 6A to 6C will be omitted. However, the process of FIG. 6A is different from the process of FIG. 5A in that a cover first pad electrode 403, a cover source electrode 153, a cover drain electrode 163, and a cover auxiliary electrode 173 are not provided.

Figure 6D:
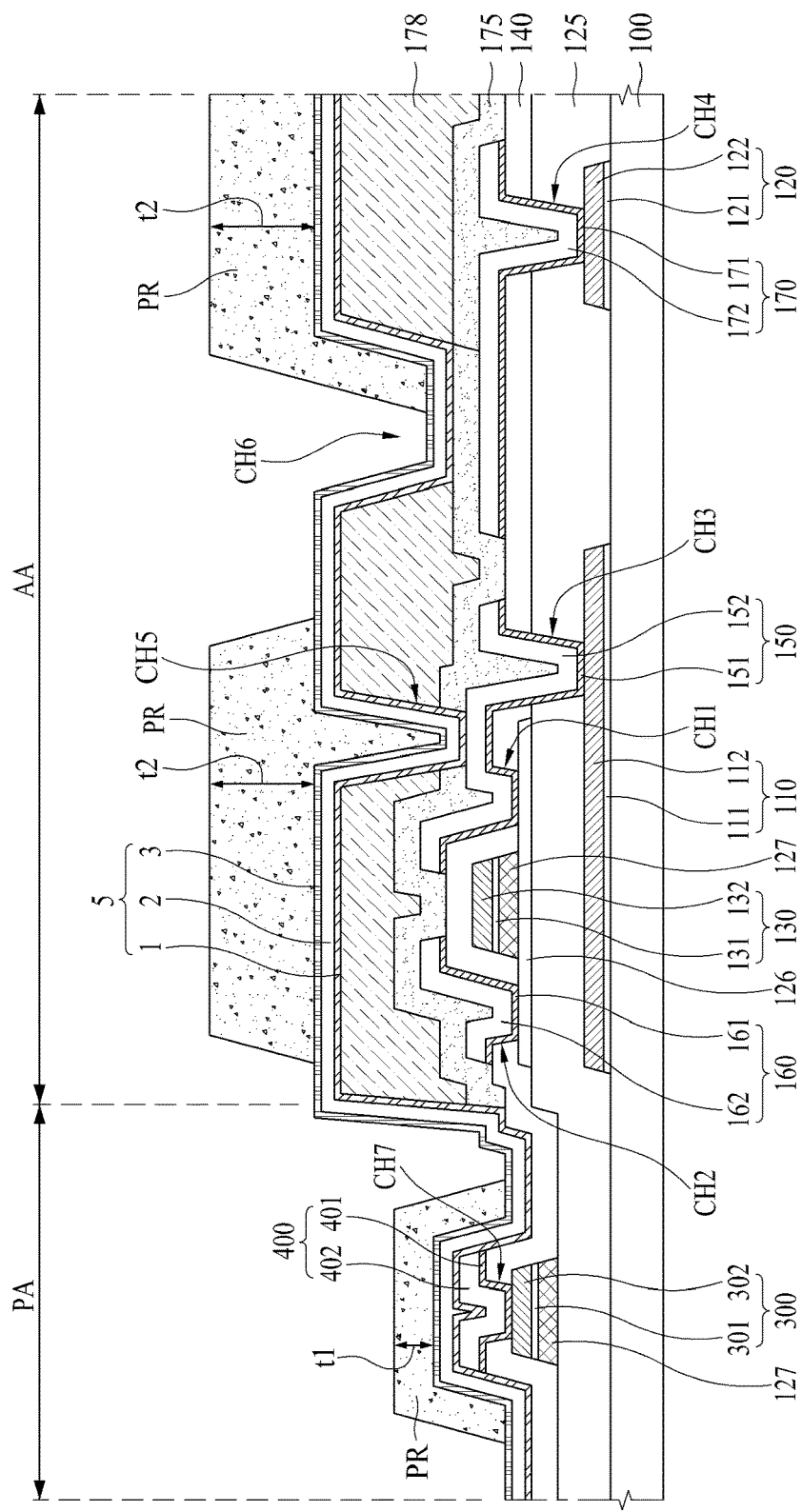

Then, as shown in FIG. 6D, an electrode layer 5 including a lower layer 1, an upper layer 2, and a cover layer 3 is provided on the planarization layer 178, and a photoresist layer (PR) is patterned on the electrode layer 5. The electrode layer 5 is provided to form the anode electrode 180 and the eave structure 190.

The photoresist layer (PR) is not provided on the pad area (PA) except the first pad electrode 400, the sixth contact hole (CH6) area, and adjoining areas of the sixth contact hole (CH6) area. The photoresist layer (PR) is provided in such a manner that a thickness (t1) of the photoresist layer (PR) on the first pad electrode 400 is relatively small, and a thickness (t2) of the photoresist layer (PR) on the remaining areas is relatively large.

Figure 6E:
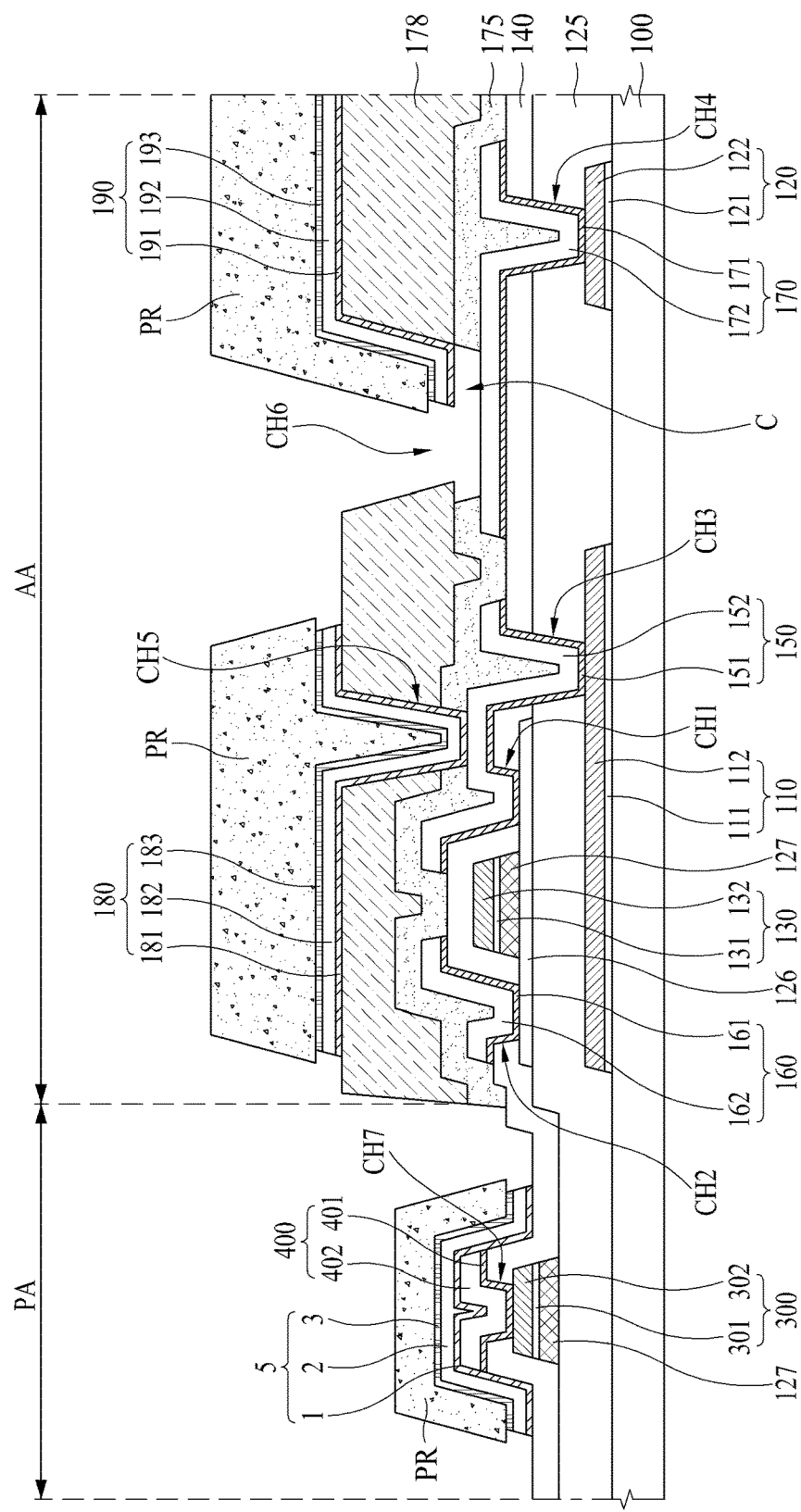

As shown in FIG. 6E, the electrode layer 5 is patterned under the condition that the photoresist layer (PR) is used as a mask, to thereby form the anode electrode 180 and the eave structure 190. In this instance, the electrode layer 5 and the passivation layer 175 provided under the electrode layer 5 are removed from the area between the anode electrode 180 and the eave structure 190 so that it is possible to form the sixth contact hole (CH6) and to expose the auxiliary electrode 170. That is, the contact space (C) is prepared under the eave structure 190 inside the sixth contact hole (CH6). Also, some of the electrode 5 on the pad area (PA) is partially removed.

Figure 6F:
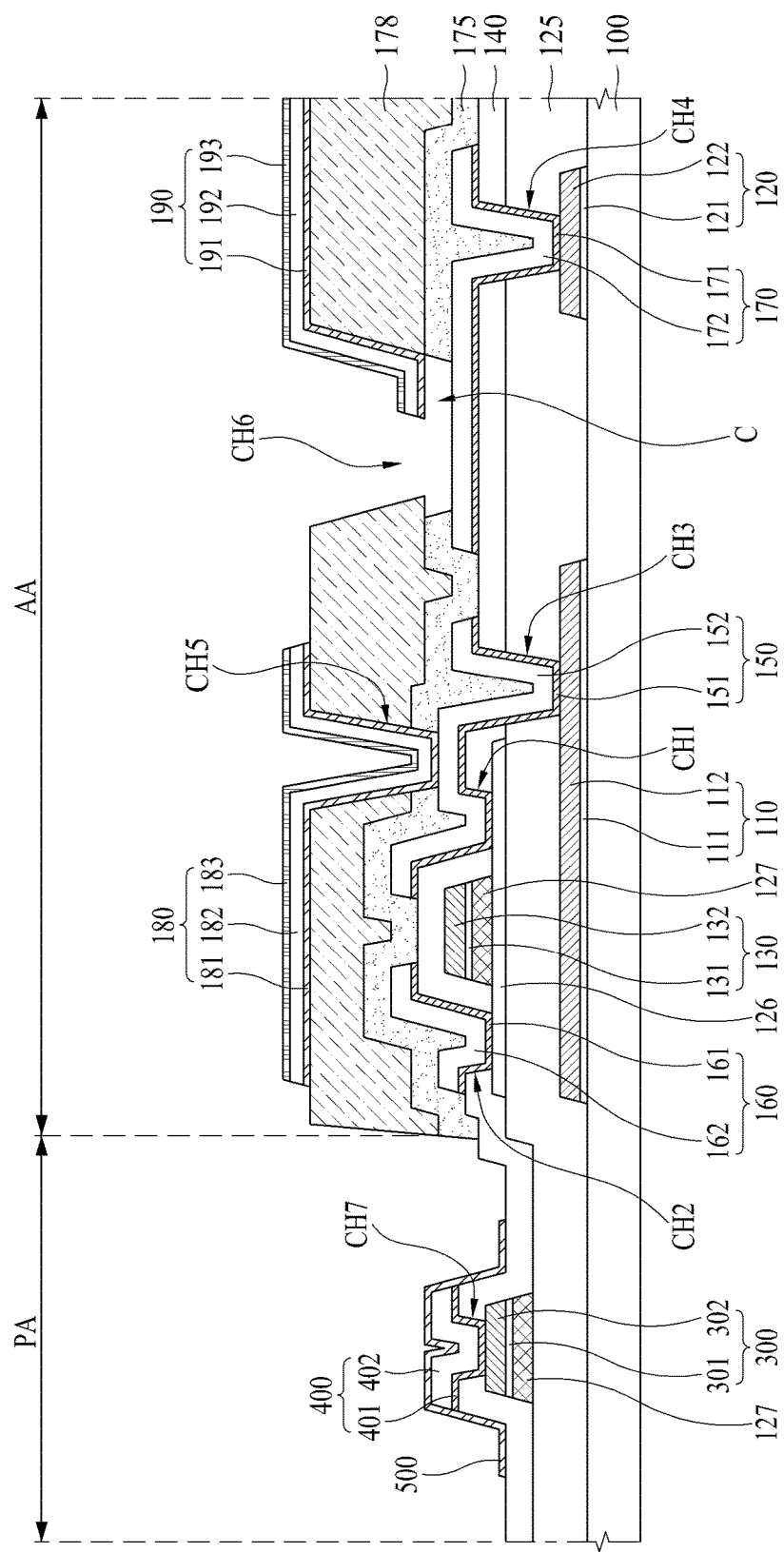

As shown in FIG. 6F, under the condition that the remaining photoresist layer (PR) is used as a mask after the ashing process of the photoresist layer (PR), the upper layer 2 and the cover layer 3 of the electrode layer 5 remaining in the pas area (PA) are removed so that it is possible to form the second pad electrode 500 of the lower layer 1, and to remove the remaining photoresist layer (PR).

By ashing the photoresist layer (PR), the photoresist layer (PR) with the relatively-small thickness (t1) is removed, and only the photoresist layer (PR) with the relatively-large thickness (t2) remains. Thus, the anode electrode 180 and the eave structure 190 are not removed from the active area (AA) when the upper layer 2 and the cover layer 3 are removed from the pad area (PA).

Figure 6G:
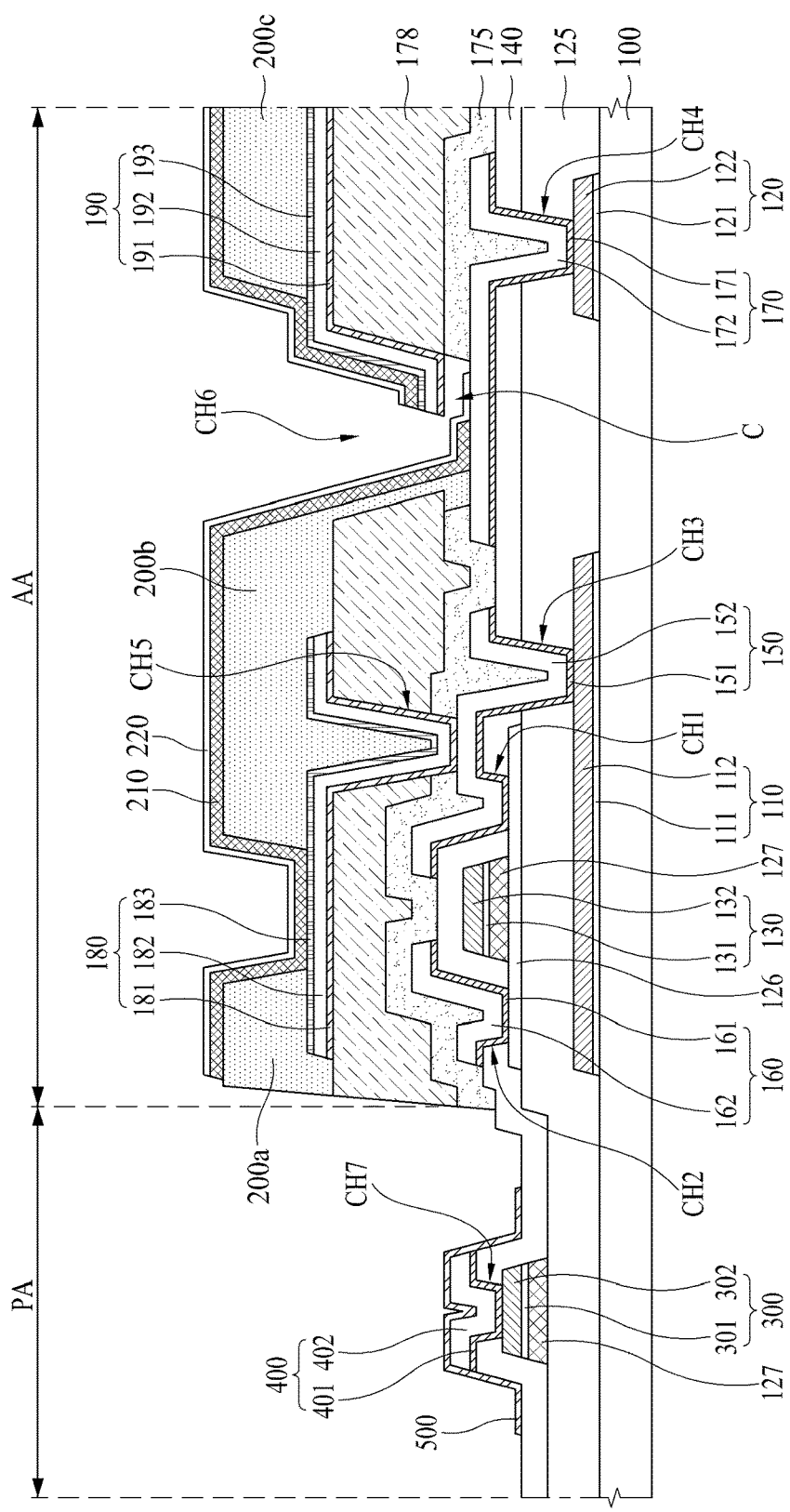

Then, as shown in FIG. 6G, the bank layer 200*a*, 200*b*, and 200*c* is formed on the anode electrode 180 and the eave structure 190, the organic emitting layer 210 is formed on the first bank 200*a*, the second bank 200*b*, and the third bank 200*c* in the active area (AA), and the cathode electrode 220 is formed on the organic emitting layer 210.

The bank layer 200*a*, 200*b*, and 200*c* may include the first bank layer 200*a* for covering one end of the anode electrode 180, the second bank layer 200*b* for covering the other end of the anode electrode 180 and extending to some area of the upper surface of the auxiliary electrode 170 along the lateral surfaces of the passivation layer 175 and the planarization layer 178 inside the sixth contact hole (CH6), and the third bank layer 200*c* provided on the eave structure 190.

The organic emitting layer 210 is not deposited in the contact space (C) under the eave structure 190. The cathode electrode 220 is deposited in the contact space (C), and is connected with the auxiliary electrode 170.

FIGS. 7A to 7F are cross sectional views illustrating a method of manufacturing the organic light emitting display device according to another embodiment of the present invention, which relate to the method of manufacturing the organic light emitting display device shown in FIG. 4. Accordingly, the same reference numbers will be used throughout the drawings to refer to the same or like parts, and a detailed description for the material in each element and the structure will be omitted.

Figure 7A:
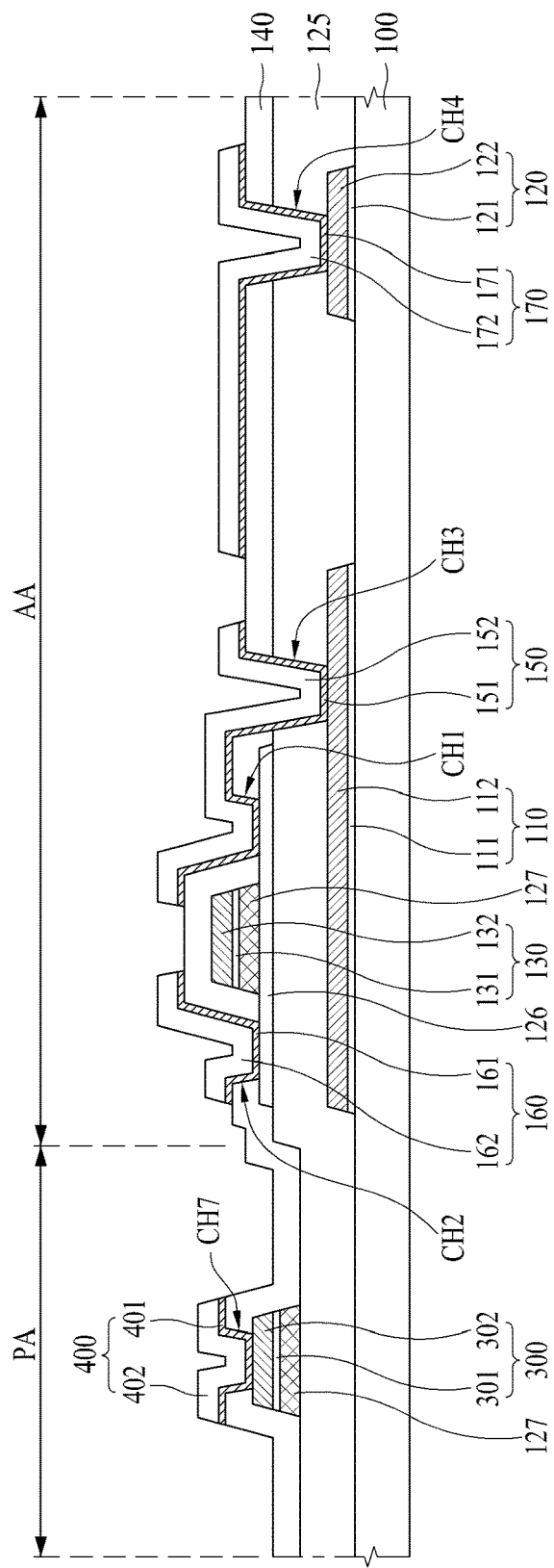
FIGS. 7A to 7F are cross sectional views illustrating a method of manufacturing the OLED device according another embodiment of the present invention, which relate to the method of manufacturing the OLED device shown in FIG. 4.

First, the process of FIG. 7A is the same as the process of FIG. 5A, whereby a detailed description for the process of FIG. 7A will be omitted. However, the process of FIG. 7A is different from the process of FIG. 5A in that a cover first pad electrode 403, a cover source electrode 153, a cover drain electrode 163, and a cover auxiliary electrode 173 are not provided.

Figure 7B:
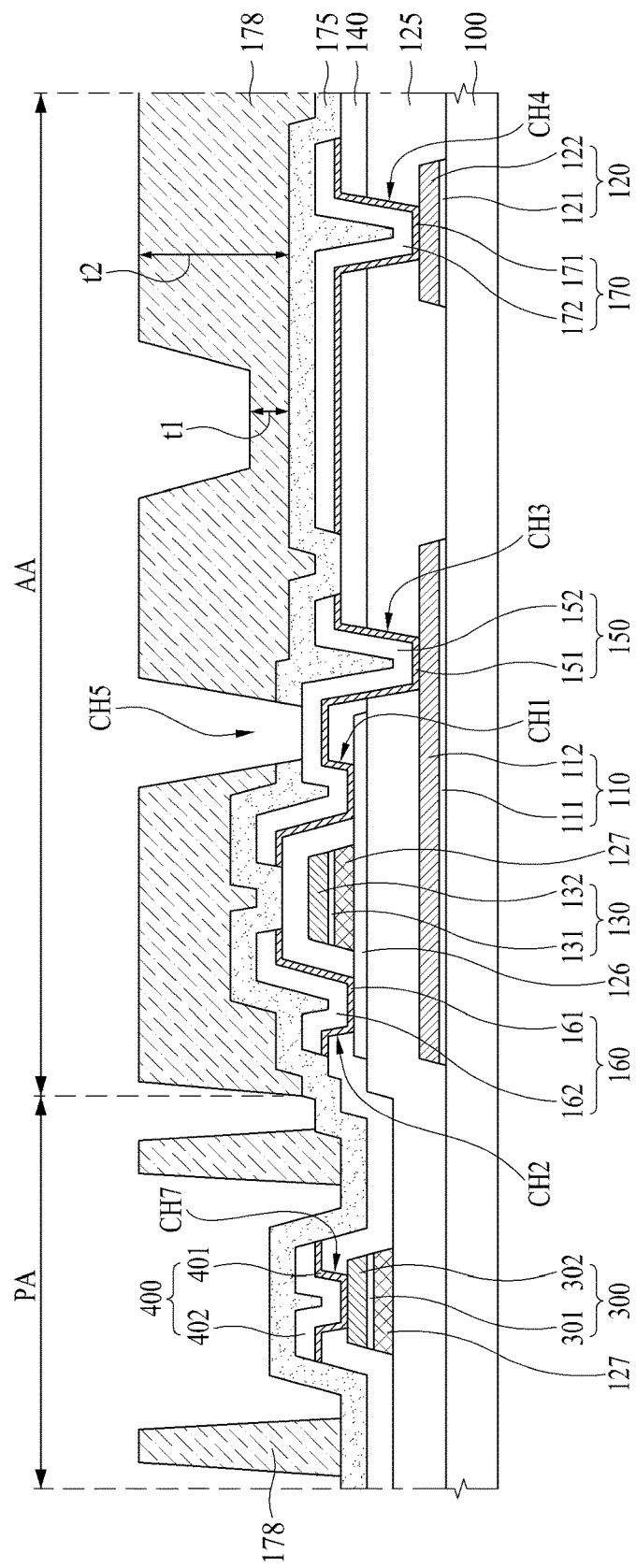

Then, as shown in FIG. 7B, the passivation layer 175 is provided on the source electrode 150, the drain electrode 160, the auxiliary electrode 170, and the first pad electrode 400, and the planarization layer 178 is patterned on the passivation layer 175.

The planarization layer 178 is not provided on some area of the source electrode 150, and the pad area (PA) except one side and the other side of the first pad electrode 400. The planarization layer 178 is provided in such a manner that a thickness (t1) of the planarization layer 178 on some area of the auxiliary electrode 170 is relatively small, and a thickness (t2) of the planarization layer 178 on the remaining areas is relatively large.

Especially, if providing the planarization layer 178 with the relatively-small thickness (t1) at one side and the other side of the first pad electrode 400, the planarization layer 178 may be peeled-off from the adjoining areas of the first pad electrode 400. Thus, the planarization layer 178 has the relatively-large thickness (t2) at one side and the other side of the first pad electrode 400.

Figure 7C:
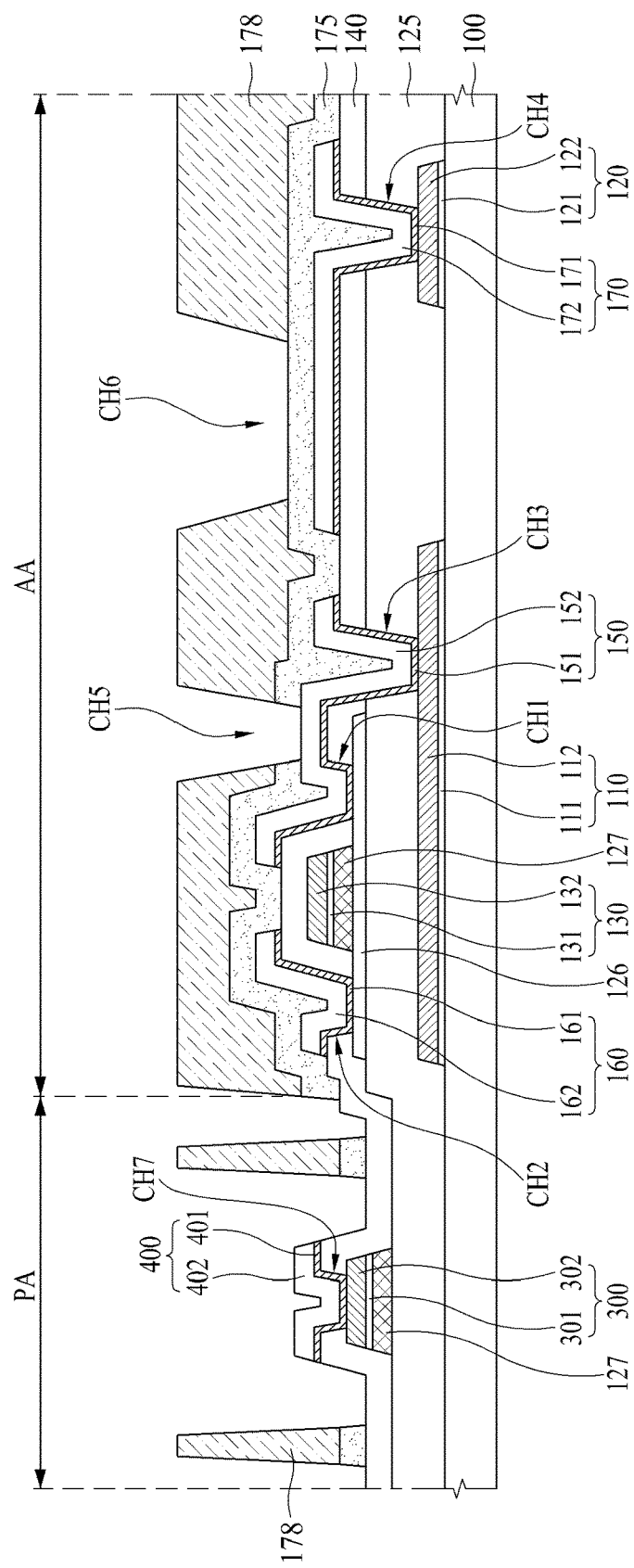

Then, as shown in FIG. 7C, under the condition that the planarization layer 178 is used as a mask, it is possible to remove the passivation layer 175 on some area of the source electrode 150, and the passivation layer 175 on some area of the pad area (PA). Thus, the fifth contact hole (CH5) is formed on the source electrode 150, whereby the source electrode 150 is exposed via the fifth contact hole (CH5), and the upper and lateral surfaces of the first pad electrode 400 are also exposed.

By ashing the planarization layer 178, the planarization layer 178 remains only in the area with the relatively-large thickness (t2), and the planarization layer 178 is removed from the area with the relatively-small thickness (t1), to thereby expose the passivation layer 175 on the auxiliary electrode 170. In this instance, the sixth contact hole (CH6) area is prepared on the auxiliary electrode 170.

Figure 7D:
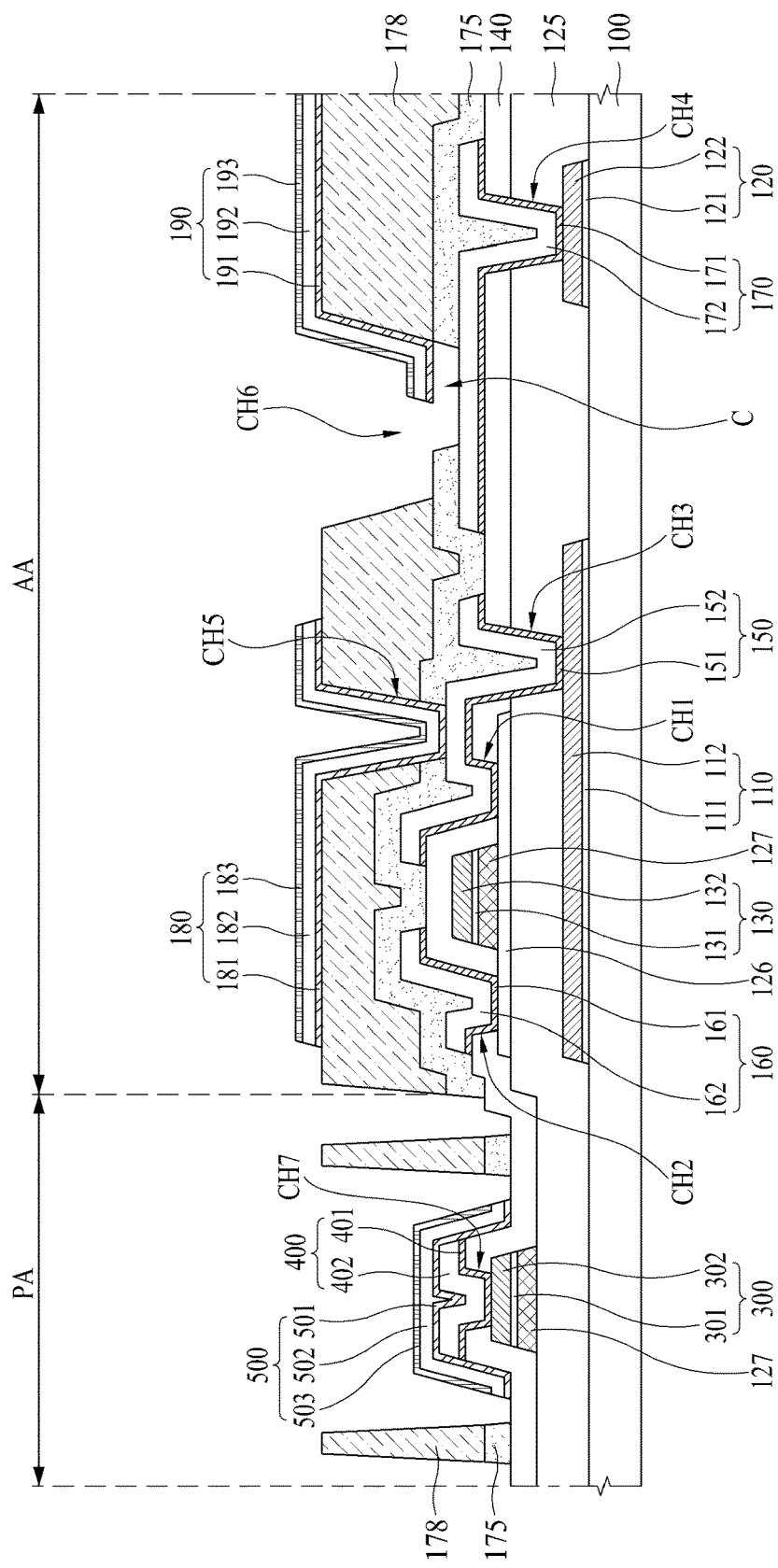

Then, as shown in FIG. 7D, the anode electrode 180 and the eave structure 190 are patterned on the planarization layer 178 of the active area (AA). In the pad area (PA), the second pad electrode 500 is patterned on the first pad electrode 400.

The anode electrode 180 is connected with the source electrode 150 via the fifth contact hole (CH5). The eave structure 190 extends to the sixth contact hole (CH6) area, and further extends to some area of the upper surface of the exposed passivation layer 175. The second pad electrode 500 covers the upper and lateral surfaces of the first pad electrode 400.

Figure 7E:
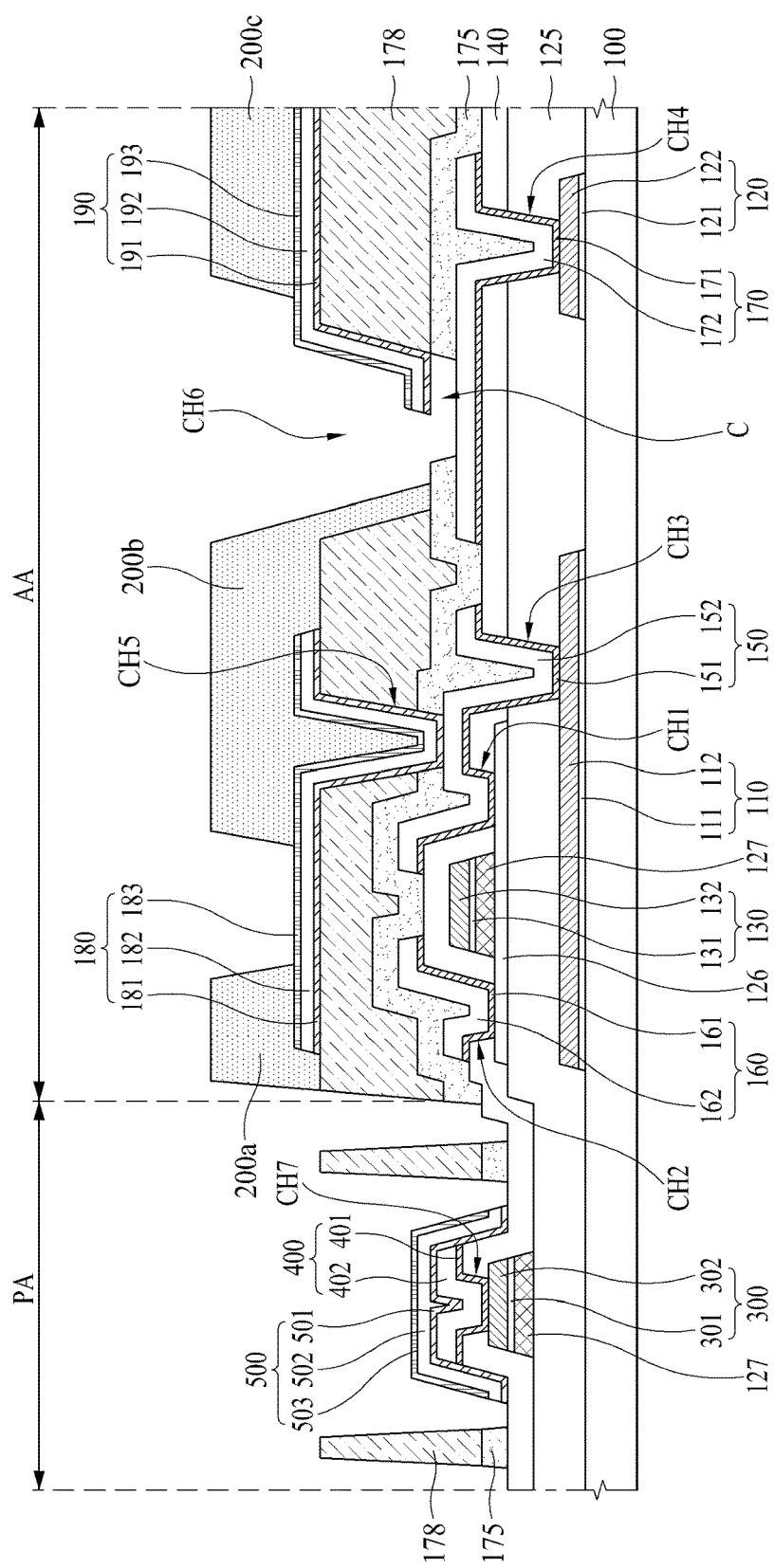

Then, as shown in FIG. 7E, the bank layer 200a, 200b, and 200c is formed on the anode electrode 180 and the eave structure 190. The bank layer 200a, 200b, and 200c may include the first bank layer 200a for covering one end of the anode electrode 180, the second bank layer 200b for covering the other end of the anode electrode 180 and extending along the lateral surface of the planarization layer 178 inside the sixth contact hole (CH6), and the third bank layer 200c provided on the eave structure 190.

After that, under the condition that the bank layer 200a, 200b, and 200c is used as a mask, the passivation layer 175 exposed via the sixth contact hole (CH6) area is removed so that it is possible to prepare the contact space (C) under the eave structure 190. Then, the structure shown in the drawings is obtained by ashing the bank layer 200a, 200b, and 200c.

Figure 7F:
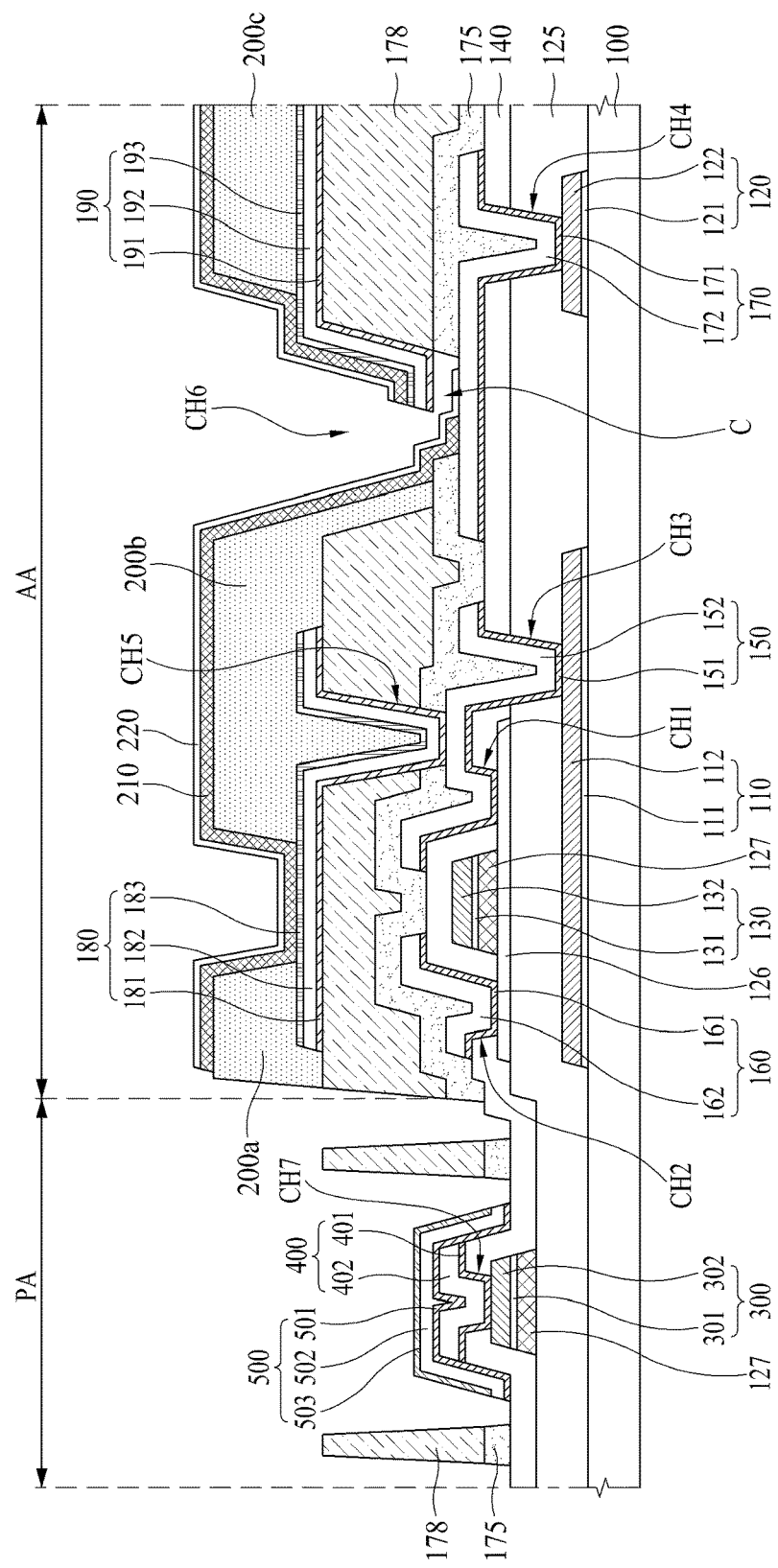

Then, as shown in FIG. 7F, the organic emitting layer 210 is formed on the first bank 200a, the second bank 200b, and the third bank 200c in the active area (AA), and the cathode electrode 200 is formed on the organic emitting layer 210. The organic emitting layer 210 is not deposited in the contact space (C) under the eave structure 190, and the cathode electrode 220 is deposited in the contact space (C) and connected with the auxiliary electrode 170.

As described above, the top emission type organic light emitting display device according to the embodiments of the present invention has been described, however, it is not limited to this type, on assumption that the technical properties of the present invention are maintained. For example, in the present invention, the light may be emitted from all areas of the pixel region, but not necessarily. The light may be emitted from not all the pixel region but some area of the pixel region. That is, the light may be emitted from some area of the pixel region, and the remaining area of the pixel region may be transparent, to thereby obtain a transparent organic light emitting display device.

According to the present invention, the cathode electrode 220 is electrically connected with the auxiliary electrode 170 in the contact space (C) under the eave structure 190. Thus, there is no need for the reverse-tapered partition structure of the related art, that is, it is possible to overcome the problems related with collapse or peeling-off of the partition.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising:
   a substrate having an active area and a pad area;
   an anode electrode on the active area of the substrate;
   a bank layer defining a pixel region on the anode electrode;
   an organic emitting layer on the bank layer and connected with the anode electrode;
   a cathode electrode on the organic emitting layer;
   an eave structure under the bank layer and spaced apart from the anode electrode;
   an auxiliary electrode under the eave structure and electrically connected with the cathode electrode; and
   a planarization layer between the eave structure and the auxiliary electrode,
   wherein the eave structure comprises a slanted first part extending along a lateral surface of the planarization layer, a second part protruding from a first end of the first part in a horizontal direction different from the first part, and a third part provided on an upper surface of the planarization layer and extending from a second end of the first part in the horizontal direction, and
   wherein the cathode electrode extends to a contact space under the second part of the eave structure, and the cathode electrode is connected with the auxiliary electrode in the contact space.

2. The OLED device according to claim 1, further comprising:
   a passivation layer under the planarization layer,
   wherein a contact hole exposing the auxiliary electrode is in the planarization layer and the passivation layer, and the contact space is connected to the contact hole.

3. The OLED device according to claim 2, wherein the bank layer extends along a lateral surface of the planarization layer inside the contact hole.

4. The OLED device according to claim 3, wherein the bank layer extends to the auxiliary electrode along the lateral surface of the passivation layer inside the contact hole.

5. The OLED device according to claim 3, wherein the organic emitting layer extends to an upper surface of the auxiliary electrode along the bank layer inside the contact hole, and the cathode electrode extends to the contact space along the organic emitting layer inside the contact hole.

6. The OLED device according to claim 2, wherein the second part of the eave structure protrudes to be parallel to a boundary surface between the passivation layer and the planarization layer.

7. The OLED device according to claim 1, wherein the eave structure is formed of the same material as that of the anode electrode, and the eave structure and the anode electrode are in the same layer.

8. The OLED device according to claim 1, further comprising a low-voltage line (VSS) under the auxiliary electrode and connected with the auxiliary electrode via an additional contact hole.

9. The OLED device according to claim 8, further comprising:
a source or drain electrode under the anode electrode and connected with the anode electrode, and a light shielding layer under the source or drain electrode,
wherein the auxiliary electrode is formed of the same material as that of the source or drain electrode, and the auxiliary electrode and the source or drain electrode are provided in the same layer, and
wherein the low-voltage line (VSS) is formed of the same material as that of the light shielding layer, and the low-voltage line (VSS) and the light shielding layer are provided in the same layer.

10. The OLED device according to claim 1, further comprising:
a signal pad on the pad area of the substrate;
a first pad electrode on the signal pad and connected with the signal pad via an additional contact hole; and
a passivation layer exposing an area of an upper surface of the first pad electrode and covering a lateral surface of the first pad electrode,
wherein the first pad electrode includes a lower first pad electrode on the signal pad, an upper first pad electrode on the lower first pad electrode, and a cover first pad electrode on the upper first pad electrode and exposed to the outside, and
wherein an oxidation degree of each of the lower first pad electrode and the cover first pad electrode is lower than an oxidation degree of the upper first pad electrode, and a resistance of a material for the upper first pad electrode is lower than a resistance of a material for each of the lower first pad electrode and the cover first pad electrode.

11. The OLED device according to claim 1, further comprising:
a signal pad on the pad area of the substrate;
a first pad electrode on the signal pad and connected with the signal pad via an additional contact hole; and
a second pad electrode covering upper and lateral surfaces of the first pad electrode,
wherein the first pad electrode includes a lower first pad electrode on the signal pad, and an upper first pad electrode on the lower first pad electrode, and
wherein an oxidation degree of the lower first pad electrode is lower than an oxidation degree of the upper first pad electrode, and a resistance of the upper first pad electrode is lower than a resistance of the lower first pad electrode.

12. The OLED device according to claim 11, further comprising a passivation layer and a planarization layer in the pad area and spaced apart from the first pad electrode and the second pad electrode.

13. A method of manufacturing an OLED device, the method comprising:
providing an auxiliary electrode on a substrate;
providing a passivation layer on the auxiliary electrode, and providing a planarization layer on the passivation layer;
providing an anode electrode and an eave structure on the planarization layer;
providing a contact hole in the passivation layer and the planarization layer so as to expose the auxiliary electrode via the contact hole;
providing a bank layer on the anode electrode and the eave structure;
providing an organic emitting layer on the anode electrode; and
providing a cathode electrode on the organic emitting layer,
wherein the eave structure comprises a slanted first part extending along a lateral surface of the planarization layer, a second part protruding from a first end of the first part in a horizontal direction different from the first part, and a third part provided on an upper surface of the planarization layer and extending from a second end of the first part in the horizontal direction, and
wherein the cathode electrode extends to a contact space under the second part of the eave structure, and the extending cathode electrode is connected with the exposed auxiliary electrode.

14. The method according to claim 13, wherein the providing of the bank layer is carried out after the providing of the anode electrode and the eave structure, and the exposing of the auxiliary electrode is carried out by the use of the bank layer functioning as a mask.

15. The method according to claim 14, further comprising:
providing a first pad electrode on the substrate, wherein the providing of the first pad electrode and the providing of the auxiliary electrode are carried out at the same time, and the planarization layer is additionally on the first pad electrode; and
exposing the first pad electrode by removing the passivation layer on the first pad electrode, wherein the exposing of the first pad electrode and the exposing of the auxiliary electrode are carried out at the same time.

16. The method according to claim 14, further comprising providing a first pad electrode on the substrate, wherein the providing of the first pad electrode and the providing of the auxiliary electrode are carried out at the same time, and the passivation layer and the planarization layer are at one side and the other side of the first pad electrode, and
wherein the providing of the anode electrode and the eave structure includes providing a second pad electrode on the first pad electrode.

17. The method according to claim 13, wherein the providing of the anode electrode and the eave structure and the exposing of the auxiliary electrode are carried out at the same time, and
wherein the providing of the bank layer is carried out after the exposing of the auxiliary electrode.

18. The method according to claim 17, further comprising:
providing a first pad electrode on the substrate, wherein the providing of the first pad electrode and the providing of the auxiliary electrode are carried out at the same time, and the providing of the anode electrode and the eave structure includes providing an electrode layer with a plurality of layers on the first pad electrode; and
providing a second pad electrode on the first pad electrode by removing some of the electrode layer in the plurality of layers after the providing of the anode electrode and the eave structure.

19. An organic light emitting display (OLED) device comprising:
a substrate having an active area and a pad area;
an anode electrode on the active area of the substrate;
a bank layer defining a pixel region on the anode electrode;

an organic emitting layer on the bank layer and connected with the anode electrode;

a cathode electrode on the organic emitting layer;

an eave structure under the bank layer and having a slanted first part, a second part and a third part, the second part and the third part being parallel to the substrate and the first part being non-parallel to the substrate, wherein the second part protrudes from a first end of the first part in a horizontal direction different from the first part and the third part extend from a second end of the first part in the horizontal direction;

an auxiliary electrode under the eave structure and electrically connected with the cathode electrode; and a contact space between the auxiliary electrode and the second part of the eave structure.

20. The OLED device according to claim 19, further comprising a planarization layer under the anode electrode, and a passivation layer under the planarization layer, wherein a lower surface of the first part is coplanar with a boundary surface between the passivation layer and the planarization layer.

\* \* \* \* \*